(12) United States Patent  
Ishikawa

(10) Patent No.: US 6,628,371 B1
(45) Date of Patent: Sep. 30, 2003

(54) EXPOSURE APPARATUS, METHOD FOR EXPOSURE, AND METHOD FOR MANUFACTURING SEMICONDUCTOR DEVICE

(75) Inventor: Jun Ishikawa, Tokyo (JP)

(73) Assignee: Nikon Corporation, Tokyo (JP)

( * ) Notice: Subject to any disclaimer, the term of this patent is extended or adjusted under 35 U.S.C. 154(b) by 49 days.

(21) Appl. No.: 09/679,390

(22) Filed: Oct. 5, 2000

(30) Foreign Application Priority Data

Oct. 8, 1999 (JP) ........................................ 11-288399

(51) Int. Cl.7 ...................... G03B 27/72; G03B 27/42; G03B 27/32; A61N 5/00; G03F 9/00
(52) U.S. Cl. ............................ 355/69; 355/53; 355/55; 355/67; 355/77; 250/492.2; 250/492.22; 430/5; 430/30
(58) Field of Search .............................. 355/53, 55, 67, 355/69, 77; 250/492.2, 492.22; 430/5, 30

(56) References Cited

U.S. PATENT DOCUMENTS

| | | | |
|---|---|---|---|
| 4,687,322 A | 8/1987 | Tanimoto et al. | |
| 4,780,747 A | 10/1988 | Suzuki et al. | |
| 4,801,977 A | 1/1989 | Ishizaka et al. | |
| 4,920,505 A | 4/1990 | Suzuki | |
| 5,673,102 A | 9/1997 | Suzuki et al. | |
| 5,864,433 A | * | 1/1999 | Takahashi et al. |
| 5,892,573 A | 4/1999 | Takahashi et al. | |
| 5,898,477 A | 4/1999 | Yoshimura et al. | |
| 5,925,887 A | 7/1999 | Sakai et al. | |
| 5,965,308 A | * | 10/1999 | Ozawa |
| 6,278,516 B1 | 8/2001 | Miwa et al. | |
| 6,414,743 B1 | 7/2002 | Nishi et al. | |
| 6,492,649 B1 | * | 12/2002 | Nei et al. |

FOREIGN PATENT DOCUMENTS

| | | |
|---|---|---|
| EP | 1 014 197 A2 | 6/2000 |
| EP | 1 014 429 A1 | 6/2000 |
| JP | A-5-343288 | 12/1993 |
| JP | B2-2765422 | 4/1998 |
| JP | A-10-116766 | 5/1998 |
| WO | WO99/05710 | 2/1999 |

* cited by examiner

Primary Examiner—Frank G. Font
Assistant Examiner—Khaled Brown
(74) Attorney, Agent, or Firm—Oliff & Berridge PLC

(57) ABSTRACT

Changes transmittance of an optical system used to expose a substrate are determined and used to control an exposure quantity of exposing light that is provided to the substrate. For example, the transmittance is measured before and after exposure of one surface in order to control the exposure quantity that is to be used to expose another surface.

25 Claims, 11 Drawing Sheets

EXPOSURE APPARATUS, METHOD FOR EXPOSURE, AND METHOD FOR MANUFACTURING SEMICONDUCTOR DEVICE

INCORPORATION BY REFERENCE

The disclosure of the following priority application is herein incorporated by reference: Japanese Patent Application No. 11-288399 filed Oct. 8, 1999.

BACKGROUND OF THE INVENTION

1. Field of the Invention

The present invention relates to an exposure apparatus employed to transfer a pattern of an original such as a mask or a reticle (hereafter referred to as a mask) onto a photosensitive substrate such as a wafer during a photolithography process implemented in the fabrication of a semiconductor device such as an LSI or a semiconductor device in an image-capturing element such as a CCD, a liquid crystal display element or a thin-film magnetic head, a method of exposure implemented by utilizing this exposure apparatus and a method for manufacturing a semiconductor device.

2. Description of the Related Art

Keeping pace with the increasingly higher integration achieved for semiconductor devices, significant progress has been made in the area of exposure apparatuses employed during the photolithography process that is crucial in the fabrication of semiconductor devices. The resolving power achieved by a projection optical system mounted at an exposure apparatus is expressed through the relational expression $R = k \times \lambda/NA$, known widely as Rayleigh's formula. In this relational expression, R represents the resolving power of the projection optical system, $\lambda$ represents the wavelength of the exposing light, NA represents the numerical aperture at the projection optical system and k represents a constant which is determined by process-related factors as well as the resolving power of the resist.

The resolving power required of the projection optical system to support higher integration in the semiconductor device may be achieved by reducing the wavelength of the light from the exposing light source or by increasing the numerical aperture at the projection optical system as the relational expression above indicates. Thus, continuous efforts to achieve a higher NA value have been made. In recent years, by using an exposure apparatus that employs an argon fluoride excimer laser (ArF excimer laser) having an output wavelength of 193 nm as an exposing light source, fine processing down to 0.18 $\mu$m–0.13 $\mu$m has become possible.

Since there are at present only two materials, i.e., synthetic quartz glass and calcium fluoride (fluorite), that may be used to constitute the lenses while achieving a satisfactory transmittance in the wavelength range of the output wavelength (193 nm) of the argon fluoride excimer laser, tireless efforts are being made to develop an optical material achieving sufficient transmittance and sufficient internal consistency to be used in this type of exposure apparatus. Currently, synthetic quartz glass achieves an internal transmittance of 0.995/cm or higher, and calcium fluoride has reached a point at which the level of internal absorption can be disregarded.

In addition, the intense efforts made in development of materials to constitute an anti-reflection film coated on the surfaces of optical members are beginning to show (tangible results and at present.) the levels of losses at the individual lens surfaces have been lowered to 0.005 or less.

In the wavelength range of ArF excimer laser light, problems occur in that moisture and organic matter may become adhered to the surfaces of the optical elements constituting the optical systems (the illumination optical system and the projection optical system) in the exposure apparatus to lower the transmittances at the optical systems and in that the glass material itself that constitutes the optical elements becomes degraded due to laser irradiation to result in poor transmittances at the optical systems. The first problem is caused by gases within the spaces enclosed by a plurality of optical elements, or moisture or organic matter originating from the inner walls or the like of the lens barrel supporting the optical systems becoming adhered to the surfaces of the optical systems. The second problem, on the other hand, is attributable to the degrading phenomenon that takes place at the glass material itself while laser light is irradiated at the glass material.

FIG. 13 illustrates time-varying transmittance characteristics in an optical system. The figure presents the optical system transmittance, which represents the ratio of the illuminance of the exposing light between the laser light source and the mask and the illuminance of the exposing light on the wafer measured over specific intervals while irradiating pulse laser light continuously from the laser light source during the laser irradiation and is calculated for each measuring time point. As FIG. 13 indicates, the transmittance at the optical system temporarily becomes lowered immediately after the start of the laser light irradiation (to be referred to as a short-term fluctuation of the transmittance since it occurs over a short period of time relative to the overall change in the transmittance) and then the transmittance gently rises to reach a near saturated state after a certain period of time (to be referred to as a long-term fluctuation of the transmittance which occurs gradually over a long period of time within the overall transmittance change). The degradation occurring at the glass material constituting the optical system causes the transmittance of the optical system to become lowered shortly after the start of the laser light irradiation. Whereas the transmittance at the optical system recovers at a large time constant after the laser light irradiation starts since moisture and organic matter adhering to the surfaces of the optical system are gradually removed from the optical system surfaces through the laser light irradiation. This phenomenon is known as optical cleaning.

It is desirable to expose a photosensitive substrate in a state in which the transmittance at the optical system does not fluctuate greatly, in order to achieve good control of the exposure quantity on the substrate. Accordingly, a near saturated state may be achieved for the transmittance by irradiating the exposing laser light over a specific period of time prior to an exposure operation. However, if an exposure operation is performed following such irradiation, a reduction in the throughput occurs, and, in addition, since the laser is oscillated over a long period of time prior to the exposure operation, the durability of the laser light source becomes lowered.

SUMMARY OF THE INVENTION

A first object of the present invention is to provide a method for exposure and an exposure apparatus that maintain the illuminance of exposing light on a photosensitive substrate (exposure object) at a target value at all times, unaffected by the change in the attenuation rate of the exposing light at an optical system occurring over time.

A second object of the present invention is to provide a method for manufacturing a semiconductor device that achieves an improvement in the yield by estimating the change in the attenuation rate of the exposing light at an illumination optical system or a projection optical system occurring over time when exposing the circuit pattern or the like onto a semiconductor substrate.

In order to achieve the objects described above, a method for exposure according to the present invention comprises a step in which a first attenuation rate of the exposing light passing through an optical system is measured before transferring an image of a pattern illuminated with the exposing light onto a first specific surface via the optical system provided within the optical path of the exposing light, a step in which a second attenuation rate of the exposing light passing through the optical system is measured after the image of the pattern is transferred onto the first specific surface, a step in which a third attenuation rate of the exposing light passing through the optical system is measured before transferring an image of the pattern onto a second specific surface different from the first specific surface and a step in which the exposure quantity achieved with the exposing light at the second specific surface is controlled based upon the first, second and third attenuation rates.

During the step for controlling the exposure quantity, time-varying change occurring in the optical characteristics of the optical system may be estimated based upon the first attenuation rate and the second attenuation rate and the estimated time-varying change to occur may be corrected based upon the third attenuation rate.

An estimation of the time-varying change in the optical characteristics to occur may be made by correcting the first attenuation rate and the second attenuation rate through approximation.

The estimated time-varying change in the optical characteristics to occur may be corrected by correcting the difference between the second attenuation rate and the third attenuation rate.

The optical system includes an illumination optical system that illuminates a mask at which the pattern is formed and a projection optical system that projects an image of the pattern onto the first or second specific surface.

The first specific surface is a photosensitive surface of an (n−1)th substrate, whereas the second specific surface is a photosensitive surface of an nth substrate.

A method for exposure according to the present invention comprises a first control step in which the exposure quantity achieved with the exposing light at a specific surface is controlled by estimating the attenuation rate of the exposing light passing through an optical system positioned in the optical path of the exposing light and a second control step different from the first control step, in which the exposure quantity achieved with the exposing light at the specific surface is controlled by estimating the attenuation rate of the exposing light passing through the optical system, with an image of a pattern illuminated with the exposing light transferred onto the specific surface via the optical system, at least, either through the first control step or the second control step.

In the first control step, the exposure quantity achieved with the exposing light at a second specific surface may be controlled based upon a first attenuation rate of the exposing light passing through the optical system before an image of the pattern is transferred onto a first specific surface, a second attenuation rate of the exposing light passing through the optical system after the image of the pattern is transferred onto the first specific surface and a third attenuation rate of the exposing light passing through the optical system before an image of the pattern is transferred onto the second specific surface which is different from the first specific surface. In the second control step, the exposure quantity achieved with the exposing light at a third specific surface may be controlled based upon the attenuation rate of the exposing light passing through the optical system before an image of the pattern is transferred onto the third specific surface and the attenuation rate of the exposing light passing through the optical system after the exposing light is irradiated on the optical system over a specific period of time.

In the second control step, the attenuation rate of the exposing light passing through the optical system during the irradiation at the optical system that takes place over the specific period of time may be measured to control the exposure quantity based upon the attenuation rates before and after the irradiation implemented over the specific period of time and the attenuation rate measured during the irradiation.

In the second control step, the length of the specific period of time may be varied in correspondence to the type of mask at which the pattern is formed.

The second control step is implemented until a specific period of time elapses after the exposure apparatus starts an exposure operation, whereas the first control step is implemented after the specific of length of time has elapsed.

The second control step may be implemented when the exposure apparatus is started up after an exposure operation has been stopped over a specific period of time.

In the second control step, a light receiver which receives the exposing light on substantially the same plane as the plane of the specific surface is provided, the light receiver receives the exposing light via the optical system while moving the mask at which the pattern is formed along a specific direction and the exposure quantity achieved with the exposing light at a specific surface may be controlled based upon the results of light reception at the light receiver before the mask is moved and the results of light reception at the light receiver during or after the mask movement.

The specific period of time mentioned above may correspond to the period of time over which at least a single shot area at the photosensitive substrate is exposed.

A method for exposure according to the present invention comprises a step in which exposing light is irradiated on an optical system over a specific period of time while moving a mask at which a pattern is formed along a specific direction before an image of the pattern illuminated with the exposing light is transferred onto a specific surface via the optical system provided within the optical path of the exposing light and a step in which the exposure quantity achieved with the exposing light irradiated onto the specific surface is controlled during the transfer based upon the attenuation rates of the exposing light passing through the optical system before and after the irradiation that takes place over the specific period of time.

A method for exposure according to the present invention includes a step in which a light receiver that receives the exposing light on substantially the same plane as the plane of the specific surface onto which an image of a pattern illuminated with the exposing light is transferred via the optical system provided in the optical path of the exposing light is provided, the light receiver receives the exposing light via the optical system while moving a mask at which the pattern is formed along a specific direction and the exposure quantity achieved with the exposing light at a specific surface is controlled based upon the results of light reception at the light receiver prior to the mask movement and the results of light reception at the light receiver during or after the mask movement.

A method for exposure according to the present invention comprises a step in which exposing light having passed through the optical axis of an optical system provided in the optical path of the exposing light and exposing light having passed through a space outside the axis are received at a light-receiving unit at the same time and the attenuation rate of the exposing light passing through the optical system is measured based upon the results of light reception at the light-receiving unit and a step in which the exposure quantity achieved with the exposing light at a specific surface onto which an image of a pattern illuminated with the exposing light is transferred is controlled in correspondence to the attenuation rate of the exposing light passing through the optical system.

A method for exposure according to the present invention comprises a step in which the attenuation rate of the exposing light passing through an optical system which projects an image of a pattern illuminated with exposing light emitted from an exposing light source onto a photosensitive substrate is measured at a plurality of different time points and a step in which the exposure quantity achieved with the exposing light at the substrate is controlled based upon a plurality of sets of attenuation rate data. In the step for measuring the attenuation rates, either a first light reception method, in which exposing light having passed through the optical axis of the optical system is received or a second light reception method in which exposing light having passed through the optical axis of the optical system and exposing light having passed through a space outside the optical axis are received, is selected and the attenuation rates of the exposing light passing through the optical system are measured based upon the results of light reception implemented through the selected light reception method, and in the step for controlling the exposure quantity, the exposure quantity is controlled in conformance to the attenuation rates of the exposing light passing through the optical system.

An exposure apparatus according to the present invention comprises a measuring device that measures a first attenuation rate of the exposing light passing through an optical system before an image of a pattern illuminated with the exposing light is transferred onto a first specific surface via the optical system provided in the optical path of the exposing light, a second attenuation rate of the exposing light passing through the optical system after the image of the pattern is transferred onto the first specific surface and a third attenuation rate of the exposing light passing through the optical system before an image of the pattern is transferred onto a second specific surface which is different from the first specific surface and a control circuit that controls the exposure quantity achieved with the exposing light at the second specific surface based upon the first, second and third attenuation rates.

An exposure apparatus according to the present invention comprises an estimating circuit that estimates an attenuation rate of the exposing light passing through an optical system at least either through a first estimating method, in which the attenuation rate of the exposing light passing through the optical system provided in the optical path of the exposing light is estimated, or a second estimating method for estimating the attenuation rate of the exposing light passing through the optical system, which is different from the first estimating method and a control circuit that controls the exposure quantity achieved with the exposing light at a specific surface onto which an image of a pattern illuminated with the exposing light is transferred via the optical system, based upon the attenuation rate of the optical system that has been estimated by the estimating circuit.

A method for manufacturing a semiconductor device according to the present invention comprises a step in which a first attenuation rate of the exposing light passing through an optical system is measured before transferring an image of a pattern illuminated with the exposing light onto a first specific surface via the optical system provided within the optical path of the exposing light, a step in which a second attenuation rate of the exposing light passing through the optical system is measured after the image of the pattern is transferred onto the first specific surface, a step in which a third attenuation rate of the exposing light passing through the optical system is measured before transferring an image of the pattern onto a second specific surface different from the first specific surface and a step in which the exposure quantity achieved with the exposing light at the second specific surface is controlled based upon the first, second and third attenuation rates.

A method for manufacturing a semiconductor device according to the present invention comprises a first control step in which the exposure quantity achieved with the exposing light at a specific surface is controlled by estimating the attenuation rate of the exposing light passing through an optical system provided within the optical path of the exposing light and a second control step different from the first control step, in which the exposure quantity achieved with the exposing light at the specific surface is controlled by estimating the attenuation rate of the exposing light passing through the optical system, with an image of the pattern illuminated with the exposing light transferred onto the specific surface via the optical system at least either through the first control step or the second control step.

DETAILED DESCRIPTION OF THE PREFERRED EMBODIMENTS

First Embodiment

Figure 1:
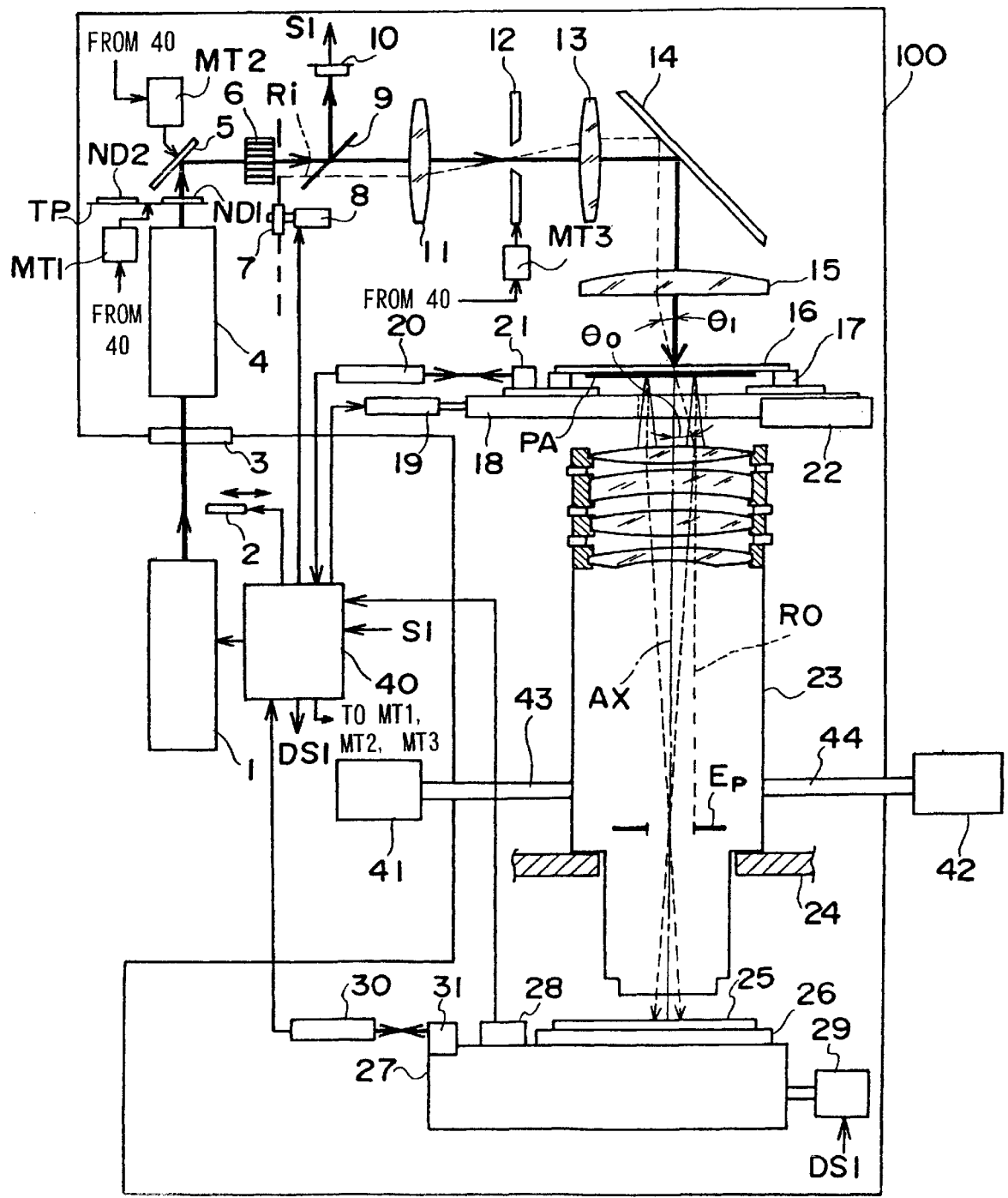
FIG. 1 schematically illustrates the structure of the exposure apparatus according to the present invention.

The following is an explanation of an embodiment of the present invention given in reference to the drawings. FIG. 1 illustrates a schematic structure of the exposure apparatus in a first embodiment of the present invention. As shown in FIG. 1, laser light constituted of an almost parallel light flux is emitted by an ArF excimer laser light source 1 that oscillates pulse light having an output wavelength of, for instance, 193 nm, and the laser light is guided to a light transmitting window 3 at a main unit of the exposure apparatus via a shutter 2. The shutter 2 closes the illumination light path during a replacement of the wafer or the reticle, for instance, thereby causing self-oscillation at the light source 1 to stabilize (adjust) beam characteristics that include at least one of: the central wavelength, the wavelength width and the intensity of the pulse light.

The main unit of the exposure apparatus is housed inside a chamber 100 and is controlled to maintain a constant temperature. The laser light having passed through the light transmitting window 3 is shaped into laser light achieving a specific cross-sectional outline at a beam shaping optical system 4, passes through one of a plurality of ND filters (ND1 in FIG. 1) having different transmittances (extinction rates) from each other that are provided at a turret plate TP to be reflected by a reflecting mirror 5 and then is guided to a fly-eye lens 6 constituting an optical integrator. The fly-eye lens 6 is constituted by bundling together a number of lens elements, with numerous light source images (secondary light sources) the number of which corresponds to the number of lens elements constituting the fly-eye lens 6 formed at the emission surfaces of the lens elements.

In this embodiment, the turret plate TP holds 6 ND filters ND1~ND6 (only ND1 and ND2 shown in the figure), and by causing the turret plate TP to rotate with a motor MT1, the 6 ND filters may be positioned within an illumination optical system in an interchangeable manner. The specific characteristics of the 6 ND filters are determined in conformance with the sensitivity of the resist on the wafer 25, the inconsistency in the oscillation intensity of the light source 1, the accuracy of control of the exposure dose at the wafer 25 and the like. In addition, an appropriate ND filter among the ND filters is selected in correspondence to the number of pulse beams (the number of exposure pulses) to be irradiated on a given point on the wafer 25 during the process of scanning exposure.

It is to be noted that instead of the turret plate TP shown in FIG. 1, for example, two plates each having a plurality of slits may be provided facing opposite each other to adjust the intensity of the pulse light by moving the two plates relative to each other along the direction in which the slits are formed.

The light source 1 oscillates pulse light in response to a trigger pulse transmitted by a light source control circuit 45 (see FIG. 5), and the light source control circuit 45 adjusts the voltage applied to the light source 1 (charging voltage) to adjust the intensity of the pulse light emitted from the light source 1. It is to be noted that the light source control circuit 45 is to be described in detail later.

In the embodiment, the intensity of the pulse light on the reticle 16, i.e., on the wafer 25, can be adjusted, at least, either through adjustment of the oscillation intensity at the light source 1 implemented by the light source control circuit 45 or through adjustment of the transmittance (beam attenuation rate) of the pulse light implemented at the turret plate TP.

In addition, in the embodiment, the mirror 5 is caused to rotate (oscillate) by a motor MT2 while the wafer 25 is being exposed using an image of the pattern at the reticle 16 by causing the reticle 16 and the wafer 25 to move in synchronization with each other. Thus, interference fringes such as speckles move within the illumination area on the reticle 16 defined by a variable-field stop 12 during scanning exposure, to achieve near consistency in the distribution of the accumulated light quantity of the pulse light on the wafer 25.

It is to be noted that while one fly-eye lens 6 is provided in this embodiment, a fly-eye lens constituting a second optical integrator may be provided between the reflecting mirror 5 and the turret plate TP. Alternatively, a rod-shaped optical member that achieves internal reflection may be employed as an optical integrator in place of the fly-eye lens.

As detailed later, at the position at which the numerous secondary light sources are formed by the fly-eye lens 6, a turret plate 7 having a plurality of aperture stops 7a~7h with, at least, either different shapes or different sizes from one another is provided. The turret plate 7, which is driven by a motor 8 to rotate, is inserted inside the optical path of the illumination optical system with one aperture stop selected in correspondence to the pattern at the reticle 16 to be transferred onto the wafer 25. The turret plate 7 and the motor 8 constitute an illumination system variable aperture stop device.

Figure 2:
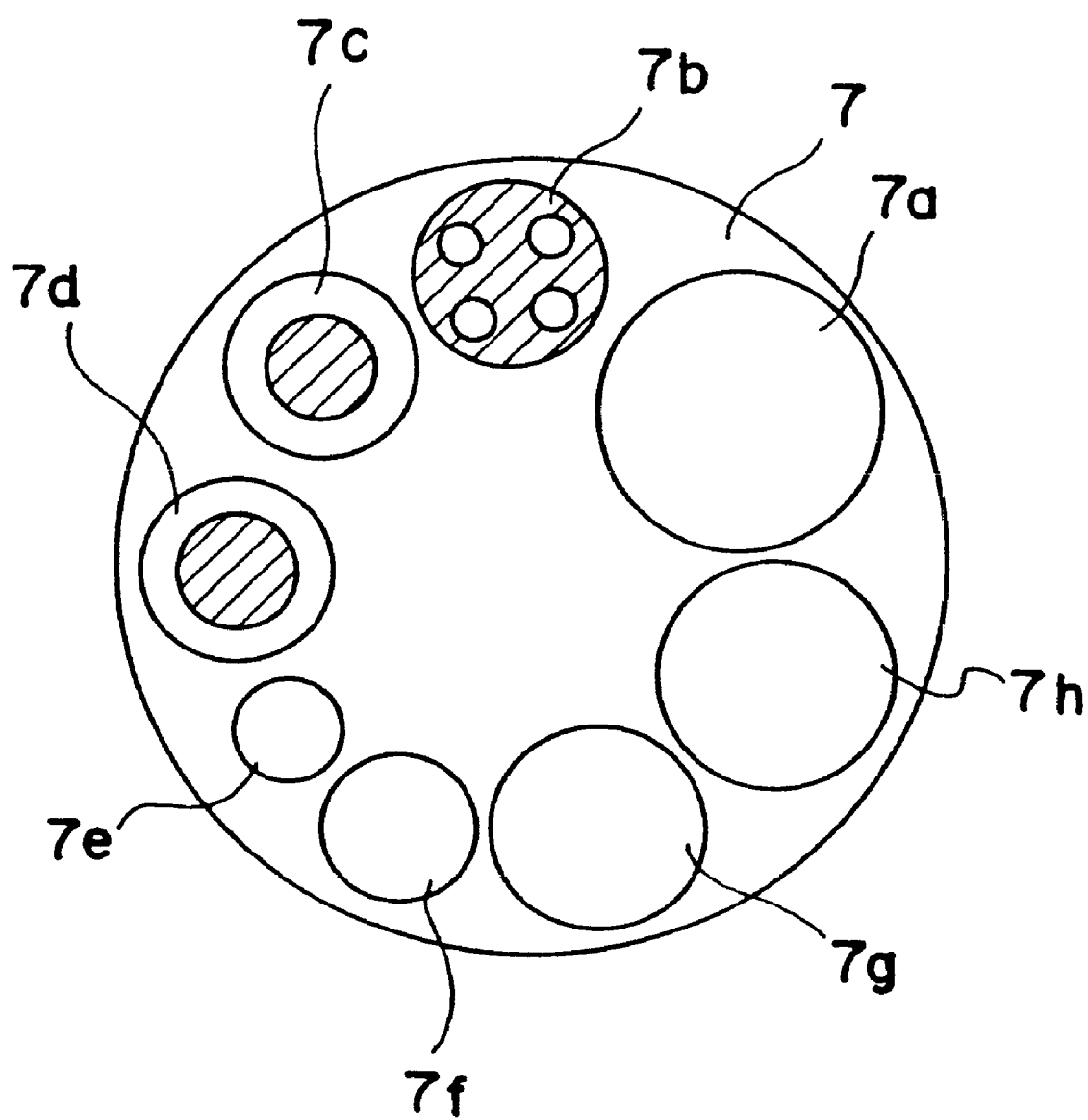
FIG. 2 illustrates the variable aperture stops formed at the turret plate shown in FIG. 1.

The turret plate 7 is provided with a plurality of aperture stops 7a~7h illustrated in FIG. 2, and one of the aperture stops is selected to suit a specific purpose of use as detailed later. As illustrated in FIG. 2, eight aperture stops 7a~7h are formed at the turret plate 7, constituted of a transparent substrate such as quartz. The five aperture stops 7a and 7e~7h have round openings and are used to forcibly change the value σ with three aperture stops 7e, 7f and 7g employed during an actual exposure operation and the remaining two aperture stops 7a. and 7h employed during an optical cleaning operation. As explained earlier, optical cleaning is a process in which contaminants such as moisture and organic substances adhering to the lens surfaces are removed from the lens surfaces by irradiating laser to improve the transmittance.

The three aperture stops 7b~7d. with irregular openings are provided to be used during an exposure operation to improve the resolving power (focal depth) of a projection optical system 23. The aperture stops 7c and 7d each has an annular aperture, and the annular ratio (the ratio of the internal diameter and the external diameter of the annular aperture) of one is different from the annular ratio of the other. The remaining aperture stop 7b has four decentered openings provided to form four decentered secondary light sources.

The turret plate 7 having the eight aperture stops 7a~7h is rotated by the motor 8 shown in FIG. 1, to set one aperture stop among the eight aperture stops, i.e., the stop having the desired aperture opening shape, in close proximity to the emission surface of the fly-eye lens 6. In other words, it is set at the focal plane on the emission side where secondary light sources are formed by the fly-eye lens 6. The drive of the motor 8 is controlled by a control circuit 40.

The light beams from the numerous secondary light sources formed by the fly-eye lens 6 are branched into two optical paths by a beam splitter 9 after they pass through the variable aperture stop at the turret plate 7, and the reflected light is guided to an integrator sensor (photoelectric detector) 10 where the illuminance of the illumination light is detected. A signal that corresponds to the detected illuminance is input to the control circuit 40. The transmitted light, on the other hand, travels through a relay lens 11, the variable field stop 12 that defines a rectangular opening and a relay lens 13 to be reflected at a reflecting mirror 14 and then is condensed at a condenser optical system 15 constituted of a refracting optical element such as a plurality of lenses. Thus, almost consistent illumination of the illumination area on the reticle 16 defined by the opening at the variable field stop 12 is achieved in a superimposed manner. Then, an image of the circuit pattern on the reticle 16 is formed on the wafer 25 by the projection optical system 23, and the resist applied onto the wafer 25 is exposed, thereby transferring the circuit pattern image onto the wafer 25.

It is to be noted that the illumination area on the reticle 16 defined by the variable field stop 12 is set to have a width along the direction in which the reticle 16 is scanned that is smaller than the width of the pattern area and a width along the direction perpendicular to the scanning direction that is larger than the width of the pattern area. In addition, the illumination area extends inside the circular image field at the projection optical system 23 along its diameter around an optical axis AX of the projection optical system 23.

By moving at least one of the blades constituting the variable field stop 12 with a motor MT3, the shape and size of the rectangular opening at the variable field stop 12 can be varied. In particular, by changing the width of the rectangular opening in the direction of the short side, the width of the illumination area along the scanning direction on the reticle 16 is changed, which makes it possible to adjust the accumulated light quantity (exposure dose) of a plurality of pulse beams irradiated on one point on the wafer 25 through scanning exposure.

As explained above, in the embodiment, the oscillation frequency at the light source 1 can be changed by a trigger pulse transmitted from the light source control circuit 45, and thus, the accumulated light quantity of a plurality of pulse beams irradiated on one point on the wafer 25 during scanning exposure can be adjusted. In addition, by changing the scanning speed at which the wafer 25 (and the reticle 16) is scanned, too, the accumulated light quantity of the plurality of pulse beams irradiated on one point on the wafer 25 during scanning exposure can be adjusted.

In a scanning exposure apparatus, at least, either the intensity of the pulse light on the wafer 25 or the number of pulse beams irradiated on the individual points on the wafer 25 during scanning exposure is adjusted to control the accumulated light quantity (exposure quantity) of the plurality of pulse beams irradiated on each point within an area of the wafer 25 that is exposed using the image of the pattern at the reticle 16 at a correct value, i.e., a value that corresponds to the sensitivity of the photoresist on the wafer 25.

In addition, optimization of the exposure quantity may be achieved by adjusting the number of pulse beams irradiated on each point on the wafer 25 instead of achieving exposure quantity optimization through the adjustment of the pulse light intensity described above. The width of the opening at the variable field stop 12, i.e., the width of the pulse light on the wafer 25 (corresponds to the projection area explained earlier) along the scanning direction, the oscillation frequency at the light source 1 and the scanning speed at which the wafer 25 is scanned can be changed independently of one another, and by changing at least one of: the pulse light width, the oscillation frequency and the scanning speed, the number of pulse beams irradiated onto each point on the wafer 25 can be adjusted. It is obvious that optimization of the exposure quantity can also be achieved by individually adjusting the intensity of the pulse light on the wafer 25 and the number of pulse beams irradiated on each point on the wafer 25.

As explained above, by adjusting at least one of; the oscillation intensity at the light source 1, the transmittance of the pulse light (beam attenuation rate), the pulse light width on the wafer 25, the oscillation frequency at the light source 1 and the scanning speed at which the wafer 25 is scanned, the exposure quantity at each point on the wafer 25 can be set at a correct value or the accuracy of control of the exposure quantity can be set within a required accuracy range (e.g., ±1~2%).

It is to be noted that the entire projection optical system 23 in the embodiment is constituted of optical elements such as refractory lenses, and an aperture stop Ep is provided at a position at which the pupil (entrance pupil) of the projection optical system 23 is located. This aperture stop Ep may be constituted of a mechanism that is capable of changing its size so that the numerical aperture at the projection optical system can be varied, and in such a case, the aperture stop Ep in the projection optical system and the variable aperture stops $7a \sim 7h$ in the illumination optical system are provided at positions that are optically conjugate with each other.

The reticle 16 is securely held at a reticle stage 18 by a reticle holder 17. The reticle stage 18 is provided on a base 22 to make a linear movement along a plane perpendicular to the sheet upon which FIG. 1 is presented. A mirror 21 is provided at the reticle holder 17, and laser light from a laser interferometer 20 is reflected by the mirror 21 to enter the laser interferometer 20, which then measures the position of the reticle stage 18. This positional information is input to the control circuit 40 and, based upon the positional information, the control circuit 40 drives a reticle stage drive motor 19 to control the position of the reticle 16 and the speed of the reticle 16 during a scanning exposure operation.

The wafer 25 is securely held at a wafer stage 27 by a wafer holder 26. The wafer stage 27 makes a linear movement along a plane perpendicular to the sheet upon which FIG. 1 is presented. A mirror 31 is provided at the wafer stage 27, and laser light from a laser interferometer 30 is reflected by the mirror 31 to enter the laser interferometer 30, which then measures the position of the wafer stage 27. This positional information is input to the control circuit 40 and, based upon the positional information, the control circuit 40 drives a wafer stage drive motor 29 to control the position of the wafer 25 and the speed of the wafer 25 during a scanning operation. An illuminance sensor (photoelectric detector) 28 is provided on the wafer stage 27 to detect the illuminance of the exposing light irradiated on the wafer 25. The illuminance sensor 28 moves over the wafer stage 27 and detects the illuminance at the optical axis AX of the projection optical system 23. The detection signal from the illuminance sensor 28 is input to the control circuit 40.

In the exposure apparatus in the embodiment, the illumination optical system is placed in an inert gas atmosphere such as nitrogen gas. For this reason, an inert gas supply device that supplies inert gas to the casing of the illumination optical system (not shown) and an inert gas discharge device that discharges contaminated inert gas from the casing are provided, as disclosed in, for instance, Japanese Laid-Open Patent Publication No. H6-260385. In addition, an inert gas such as nitrogen gas is also supplied to a plurality of spaces formed between the plurality of optical members constituting the projection optical system 23, and contaminated inert gas is discharged from the plurality of spaces. To achieve this, an inert gas supply device 41 and an inert gas discharge device 42 are provided, with the gas supply device 41 supplying inert gas such as dry nitrogen into the projection optical system 23 via a pipe 43 and the discharge device 42 discharging the gas inside the projection optical system 23 via a pipe 44. It is to be noted that the inert gas used in the exposure apparatus does not need to be nitrogen, and selection may be made from gases including helium and argon.

The operation achieved in the exposure apparatus in the embodiment is now explained. First, as illustrated in FIG. 1, inert gas such as dry nitrogen is supplied from the gas supply device 41 into the projection optical system 23 via the pipe 43, and when the projection optical system is fully charged with the inert gas, the gas in the projection optical system 23 is discharged to the outside via the pipe 44 by the discharge device 42. The entire optical path through which the exposing light travels in the illumination optical system is also arranged in a sealed structure as in the projection optical system 23, and likewise, inert gas such as dry nitrogen is supplied and charged into the illumination optical system in a similar manner and the gas inside the illumination optical system is discharged by the discharge device.

It is to be noted that it is desirable to keep the atmosphere among the optical elements such as lens chambers in a dry, cleaned state at all times by engaging the gas supply device 41 and the gas discharge device 42 in constant operation during exposure. The same principle applies to the atmosphere in the illumination optical system.

Next, employing a reticle loading mechanism (not shown), the reticle 16 on which a pattern to be transferred is drawn is delivered and placed onto the reticle stage 18. At this time, the position of the reticle 16 is measured with a reticle alignment system (not shown) and the reticle 16 is set at a specific position with a reticle position control circuit (not shown) based upon the results of the measurement.

The glass material constituting the optical system in the embodiment is now explained. In the ultraviolet range that includes ArF laser light which is used in the embodiment, only limited types of glass materials, such as synthetic quartz (SiO2), synthetic quartz with fluorine doped over and fluorite allow light with a wave length of down to approximately 160 nm to be transmitted with transmittances which are viable in practical use. Since fluorite is expensive in general, the majority of glass materials constituting the refracting optical members at the illumination optical system and the projection optical system 23 in the embodiment is formed from synthetic quartz. However, synthetic quartz has a tendency whereby its transmittance becomes reversibly lowered due to solarization when it is continuously irradiated with ultraviolet pulse light. This solarization refers to a phenomenon in which the transmittance becomes lowered when ultraviolet pulse light is irradiated on synthetic quartz and the transmittance increases (the transmittance is restored) when the irradiation of the ultraviolet pulse light is stopped.

The synthetic quartz used in projection exposure apparatuses is now explained in detail. Synthetic quartz or a single crystal of a fluoride such as calcium fluoride (CaF2) is normally used to constitute optical members in a projection exposure apparatus which uses an ArF excimer laser light source as its exposing light source. Since the image-forming optical system of a projection exposure apparatus is constituted by using numerous lenses (optical members) each having a large diameter and a large thickness of, for instance, $\phi 200$ mm×t20 mm, its optical path length is extremely large. Accordingly, it is necessary to improve the transmittances of the individual optical members (to lower the attenuation rates of the exposing light), in order to achieve a better transmittance for the entire optical system (in order to lower the attenuation rate of the exposing light).

If optical members with low transmittances are used, the temperature of the optical members rises as they absorb the exposing light to result in inconsistency in the refractive indices of the optical members. In addition, the optical performance is compromised by local thermal expansion occurring at the optical members which causes their surfaces to become deformed. The optical members should preferably achieve an internal transmittance of 99.5%/cm or higher. In addition, since the image-forming performance (resolution) becomes poor if the refractive index distribution is inconsistent or if there is distortion (double refraction) at the optical members, it is desirable that the consistency $\Delta n$ of the refractive index distribution is maintained at $4 \times 10^{-6}$ or lower and the distortion is maintained at 4 nm/cm or lower.

An ArF excimer laser light source, which is a high energy pulse laser, induces so-called laser damage, i.e., changes in the transmittance and the structure, due to defects inside the crystal caused by the irradiation of ArF excimer laser light even in synthetic quartz which demonstrates more stable characteristics than other optical materials. Such laser damage is observed less frequently in synthetic quartz having an OH group concentration of 800~1000 ppm and a hydrogen molecular concentration of $2 \times 10^{17}$ molecules/cm$^3$ or higher. Fluorine or hydrogen may be doped to improve the durability of the synthetic quartz against laser light.

While optical thin film layers having various structures are formed at the optical members of a projection exposure apparatus in order to retain desired optical characteristics, these film layers, too, are constituted of materials that do not readily allow a light quantity loss caused by the absorption of the ArF excimer laser light constituting the exposing light, deformation of the substrate surface or film layer breakdown attributable to the heat generated as the exposing light is absorbed, i.e., materials that achieve high transmittances and a high degree of durability with respect to ArF excimer laser light. In addition, a clouding substance may become deposited at the surfaces of refractive optical members (lenses or the like) and reflective optical members (mirrors or the like) due to a chemical reaction or the like caused by ultraviolet pulse light, resulting in fluctuation of the transmittance or the reflectance. Such a clouding substance may be removed through optical cleaning implemented by irradiating ultraviolet pulse light with the laser light output set higher than normal. However, since dry nitrogen gas with impurities already removed is supplied into the illumination optical system and the projection optical system 23, fluctuations of the transmittance and the reflectance attributable to the clouding substance are minimized in the embodiment. The attenuation rate as referred to in the present invention includes fluctuations of the transmittance and the reflectance.

Since the projection optical system 23 has a considerably larger number of refractive optical members than the illumination optical system, the fluctuation of the transmittance of the exposing light occurring in the optical path extending from the half-mirror 9 to the wafer 25 is, for the most part, attributed to the transmittance fluctuation occurring at the projection optical system 23. The following is an explanation of a method which may be adopted to prevent the accuracy of the exposure quantity control from becoming lowered due to fluctuations in the transmittance at the projection optical system 23 caused by an irradiation of ultraviolet pulse light.

Control Achieved in Conjunction with Dummy Irradiation

A dummy irradiation is performed before starting an exposure process to calculate the transmittance of the exposing light passing through the projection optical system 23. An explanation will be made on the necessity for such a dummy irradiation. The transmittance at the optical system becomes temporarily reduced when laser light is irradiated on the optical system as described earlier. In particular, the transmittance changes greatly immediately after an exposure start, e.g., during the exposure of the first and second wafers. As a result, since the transmittance at the projection optical system 23 is lowered when exposing the first and second photosensitive substrates, optimal. control of the exposure quantity cannot be achieved. Accordingly, it is necessary to estimate the degree to which the transmittance at the optical system will be lowered, in order to achieve accurate exposure quantity control.

In order to estimate the degree to which the transmittance will be lowered, the illuminance sensor 28 is set on the optical axis AX of the projection optical system 23 and then a blank emission of a specific number of pulses, i.e., a dummy irradiation, is performed by driving the laser light source 1. The number of pulses emitted during this step should be set at a value which is determined in advance in correspondence to the irradiation power per unit area over which the laser light is irradiated. For instance, if the exposure quantity is 5 (mJ/cm$^2$), the number of pulses required to expose a single hot is set at 100. Since the laser light source 1 emits light over specific intervals in conformance to the number of emitted pulses (the number of shots) thus set, the period of time required for the light emission is determined by setting the number of shots. It is to be noted that the number of emitted pulses per shot required for the dummy irradiation and the number of shots (the total number of emitted pulses) required for the dummy irradiation can be set freely. For instance, a dummy irradiation may be implemented for three shots.

Figure 3:
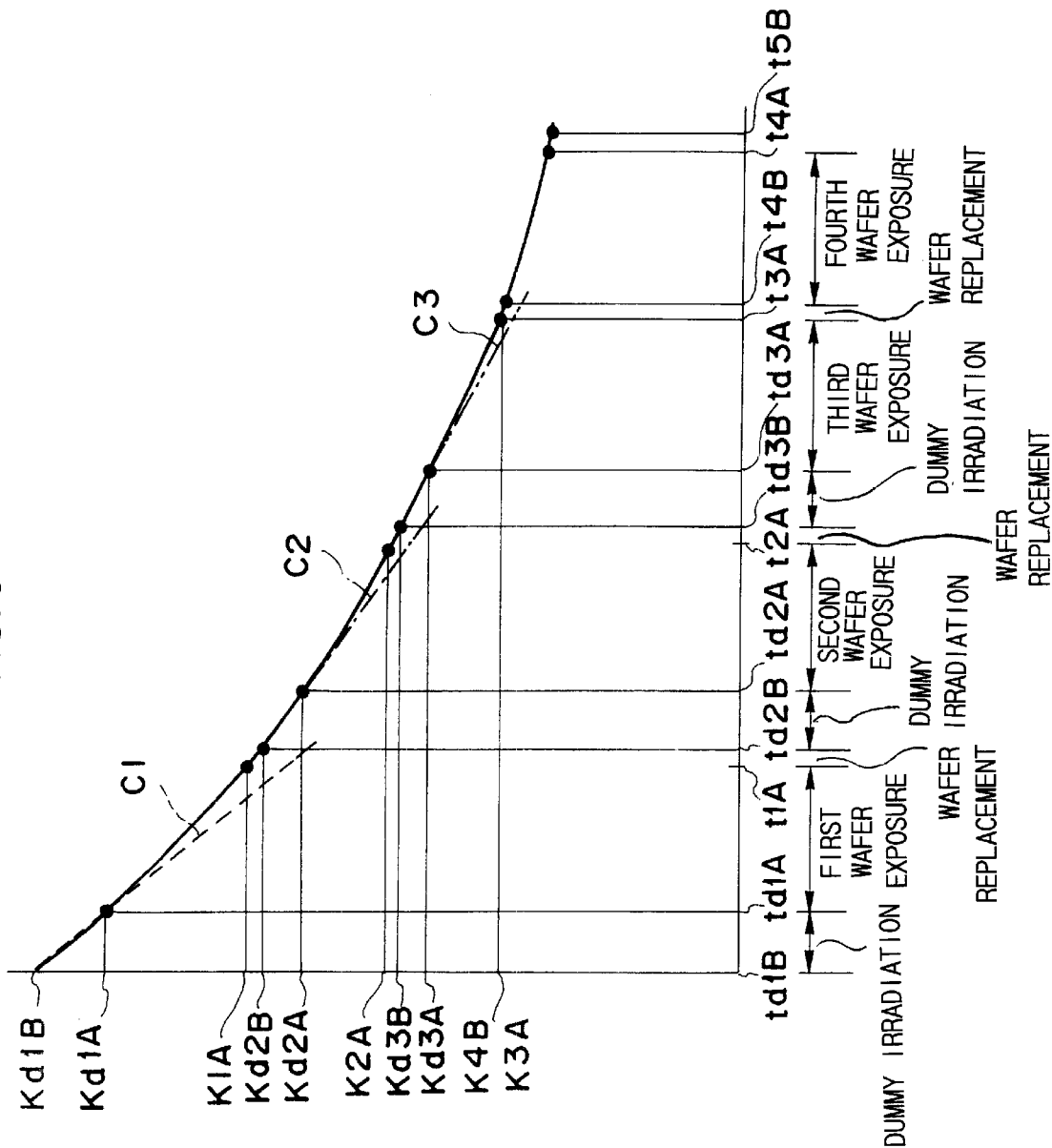
FIG. 3 presents a graph illustrating the relationship between the length of the exposure period and the transmittance.

Prior to the dummy irradiation, the transmittance at the projection optical system 23 is measured. In synchronization with a single pulse emission implemented for transmittance measurement, the illuminance of the exposing light is individually measured by the integrator sensor 10 and the illuminance sensor 28. The ratio LW/LI of the output LI from the integrator sensor 10 and the output LW from the illuminance sensor 28 is then calculated. This ratio represents the transmittance Kd1B at the start (the time point preceding the dummy irradiation that is performed prior to the exposure of the first wafer: td1B) of the exposure step shown in FIG. 3. It is to be noted that 1−(transmittance)= (attenuation rate). In FIG. 3, the horizontal axis represents the exposure period and the vertical axis represents the transmittance. Next, a hundred pulse emissions (dummy irradiation), for instance, are performed at one shot. In synchronization with a single pulse emission implemented for transmittance measurement following the dummy irradiation, the illuminance of the exposing light is individually measured by the integrator sensor 10 and the illuminance sensor 28. The ratio LW/LI of the output LI from the integrator sensor 10 and the output LW from the illuminance sensor 28 is then calculated. This ratio represents the transmittance Kd1A at a time point: Td1A following the dummy irradiation which is performed prior to the exposure of the first wafer in FIG. 3. When the dummy irradiation is performed, the wafer 27 is stopped after the illuminance sensor 28 is positioned on the optical axis of the projection optical system 23, and the reticle 16 is moved. In other words, the reticle stage 18 is engaged in an operation similar to the operation performed during a scanning exposure operation.

As explained above, since the glass material itself constituting the optical system becomes degraded due to the dummy irradiation, the measured transmittance at the optical system becomes lower and Kd1B becomes greater than Kd1A. Estimated time-varying transmittance characteristics C1 represented as the straight line connecting these two transmittances Kd1B and Kd1A are calculated through the following expression (1).

$$C1=(Kd1A-Kd1B)\cdot X/1stS+Kd1A \qquad (1),$$

with

X: number of irradiation pulses emitted during wafer exposure

1stS: number of irradiation pulses emitted during dummy irradiation preceding exposure of first wafer.

Next, the first wafer 25 is moved to the exposure start position by moving the wafer stage 27, and the exposure step for exposing the circuit pattern on the reticle 16 onto the wafer 25 starts. Namely, while controlling the light emission intensity of the laser light by using the estimated characteristics C1 so as to achieve a constant level for the irradiation power irradiated onto the wafer 25, the pattern at the reticle 16 is transferred onto the first wafer 25. When the exposure of the first wafer 25 is completed, the wafer stage 27 is moved and the illuminance sensor 28 is repositioned on the optical axis AX of the projection optical system 23. In synchronization with a single pulse emission performed for transmittance measurement, the illuminance of the exposing light is individually measured by the integrator sensor 10 and the illuminance sensor 28. The ratio LW/LI of the output LI from the integrator sensor 10 and the output LW from the illuminance sensor 28 is then calculated. This ratio represents the transmittance K1A at a time point: T1A after the exposure of the first wafer in FIG. 3.

Next, the wafer 25 is replaced with a second wafer 25 which is then aligned. By driving the wafer stage 27, the illuminance sensor 28 is moved onto the optical axis AX of the projection optical system 23 and a dummy irradiation is performed prior to the exposure of the second wafer 25. As in the dummy irradiation performed before the exposure of the first wafer 25, the illuminance of the exposing light is individually measured by the integrator sensor 10 and the illuminance sensor 28 in synchronization with a single pulse emission performed prior to the dummy irradiation. The ratio LW/LI of the output LI from the integrator sensor 10 and the output LW from the illuminance sensor 28 is then calculated to ascertain the transmittance Kd2B at a time point: td2B before the dummy irradiation which is implemented prior to the exposure of the second wafer 25. Then, a plurality of pulse emissions corrsponding to one shot, for instance, are implemented and, in synchronization with the single pulse emission implemented for transmittance measurement, the illuminance of the exposing light is individually measured by the integrator sensor 10 and the illuminance sensor 28. The ratio LW/LI of the output LI from the integrator sensor 10 and the output LW from the illuminance sensor 28 is calculated to ascertain the transmittance Kd2A at a time point: Td2A after the dummy irradiation which is performed prior to the exposure of the second wafer 25. Estimated time-varying transmittance characteristics C2 which is represented as the straight line connecting the two transmittances Kd2B and Kd2A thus obtained is calculated through the following expression (2);

$$C2=(Kd2A-Kd2B)\cdot X/2stS+Kd2A \quad (2),$$

with 2stS: number of irradiation pulses emitted during dummy irradiation prior to exposure of the second wafer.

Next, the second wafer 25 is moved to the exposure start position by moving the wafer stage 27, and the exposure step for exposing the wafer 25 with the circuit pattern on the reticle 16 starts. Namely, while controlling the light emission intensity of the laser light by using the estimated characteristics C2 so as to achieve a constant level for the irradiation power of the light irradiated by the laser light source 1 onto the wafer 25, the pattern at the reticle 16 is transferred onto the second wafer 25. When the exposure of the second wafer 25 is completed, the wafer stage 27 is moved and the illuminance sensor 28 is repositioned on the optical axis AX of the projection optical system 23. In synchronization with a single pulse emission performed for transmittance measurement, the illuminance of the exposing light is individually measured by the integrator sensor 10 and the illuminance sensor 28. The ratio LW/LI of the output LI from the integrator sensor 10 and the output LW from the illuminance sensor 28 is then calculated. This ratio represents the transmittance K2A at a time point: T2A after the exposure of the second wafer in FIG. 3.

Next, the wafer 25 is replaced with a third wafer 25. By driving the wafer stage 27, the illuminance sensor 28 is moved onto the optical axis AX of the projection optical system 23 and a dummy irradiation is performed prior to the exposure of the third wafer 25. Estimated characteristics C3 are calculated in a similar manner to that with which the characteristics are calculated for the first and second wafers, and the third wafer 25 is exposed based upon the estimated characteristics C3 thus calculated. As described above, a dummy irradiation is performed prior to the exposure of an mth wafer 25 within a specific period of time after the exposure apparatus is started up. The formula used to calculate estimated time-varying exposure transmittance characteristics Cm during the exposure of the mth wafer 25 is expressed as follows in expression (3);

$$Cm=(KdmA-KdmB)\cdot X/mstS+KdmA \quad (3)$$

Namely, when exposing the mth wafer 25, the exposure quantity for the mth wafer 25 is controlled by performing a dummy irradiation prior to the exposure of the wafer 25 and using the estimated time-varying transmittance characteristics calculated based upon the transmittances at the optical system measured before and after the dummy irradiation. This exposure quantity control is implemented until a specific period of time elapses following the start of the exposure step, i.e., following the time point: td1B at which the first pulse emission is performed prior to the dummy irradiation which is implemented before the exposure of the first wafer 25. This specific period of time may be, for instance, the period of time elapsing until the exposure processing of the third wafer 25 ends.

Figure 4:
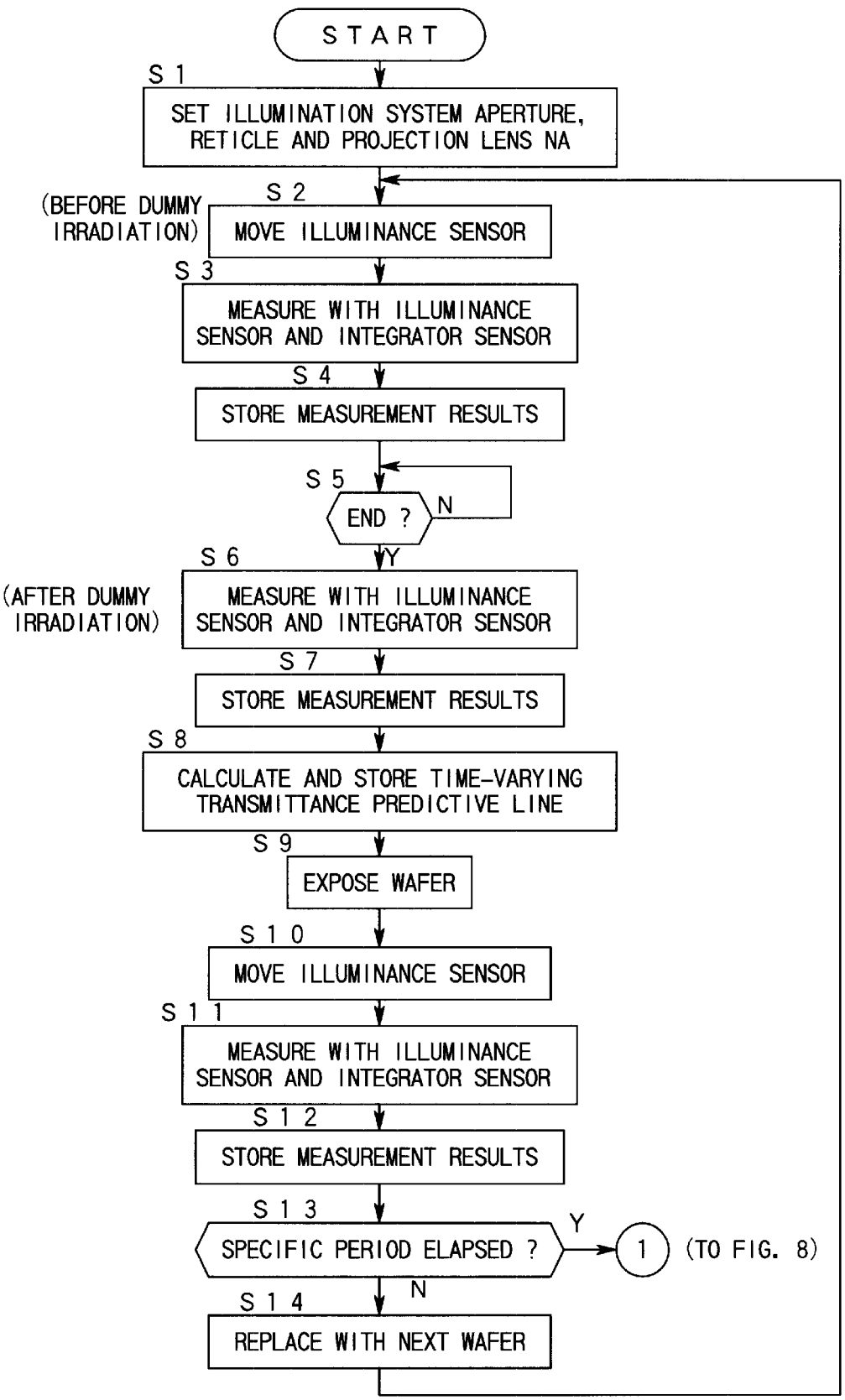
FIG. 4 is a flowchart of the procedure for performing exposure by calculating time-varying transmittance characteristics while implementing a dummy irradiation.

FIG. 4 is a flow chart of the procedure implemented to calculate time-varying transmittance characteristics through dummy irradiation and perform an exposure operation. This procedure is sequentially implemented by a CPU of the control circuit 40 in conformance with a program loaded at the control circuit 40. In step S1, the variable aperture stop at the illumination optical system, the reticle type, the numerical aperture NA at the projection optical system and the number of shots are set. Based upon these settings, the turret plate 7 is driven to rotate by the motor 8, the aperture stop that forms secondary light sources with the shape and the size corresponding to the selected type is inserted in the illumination optical path and the numerical aperture NA at the projection optical system 23 is adjusted by the aperture stop Ep. In addition, the selected reticle 16 is delivered from the reticle library and is set at the reticle stage 18. The wafer 25 is delivered by a wafer loading mechanism (not shown) and is placed on the wafer stage 27. After the wafer 25 is placed on the wafer stage 27, the wafer is aligned on the wafer stage 27 and is securely sustained. A resist, which is a photosensitive material is applied in advance onto the surface of the wafer 25 onto which the pattern at the reticle 16 is to be transferred.

In step S2, the wafer stage 27 is moved to position the illuminance sensor 28 on the optical axis AX of the projection optical system 23. In addition, the window for illuminance measurement provided on the reticle 16 which is to be detailed later is aligned at a position that is conjugate with the illuminance sensor 28 relative to the projection optical system 23 by moving the reticle stage 18. In step S3, laser light for transmittance measurement is emitted by driving the laser light source 1, the illuminance LI of the exposing light reflected by the mirror 9 is detected by the integrator sensor 10 and the illuminance LW of the exposing light on the wafer stage 27 is detected by the illuminance sensor 28 (pre-dummy irradiation measurement). Based upon the value of the illuminance LI detected by the integrator sensor 10, the ND filter with the optimal transmittance is ascertained. In step S4, the results of the detection of the illuminances LI and LW are stored as the illuminances obtained through a pre-dummy irradiation detection. In step S5, the dummy irradiation is performed and when it is decided that the dummy irradiation for 100 pulses is completed, the operation proceeds to step S6. It is to be noted that during the dummy irradiation, part of the pattern of the reticle 16 is selectively illuminated through the variable field stop (reticle blind) 12 and the reticle 16 is caused to move via the reticle stage 18 relative to the illumination area defined by the variable field stop 12. In other words, the dummy irradiation is performed by scanning the reticle 16 as in the scanning transfer which is to be detailed later.

In step S6, the illuminance LI of the exposing light reflected by the mirror 9 is detected by the integrator sensor 10 and the illuminance LW of the exposing light on the wafer stage 27 is detected by the illuminance sensor 28 (post-dummy irradiation measurement) while laser light is emitted for transmittance measurement. Based upon the value of the illuminance LI detected by the integrator sensor 10, the number of pulses required to expose one shot on the wafer and the traveling speed of the reticle stage 18 and the wafer stage 27 corresponding to the number of pulses are determined. In step S7, the results of the detection of the illuminance LI and the illuminance LW are stored as the illuminances detected after the dummy irradiation.

In step S8, based upon the illuminances detected before the dummy irradiation and the illuminances detected after the dummy irradiation, the estimated time-varying transmittance characteristics are calculated. As shown in FIG. 3, the transmittance Kd1B representing the ratio LW/LI of the illuminances detected at the time point: td1B before the dummy irradiation which is performed prior to the exposure of the first wafer 25 and the transmittance Kd1A representing the ratio LW/LI of the illuminances detected at the time point: td1A after the dummy irradiation performed prior to the exposure of the first wafer 25 are calculated. Next, estimated characteristics are obtained as the straight line connecting these points Kd1B and Kd1A. These estimated time-varying transmittance characteristics are stored in memory as a linear function. Instead of storing the linear function, a table of the transmittance relative to the length of exposure period may be stored in a storage device 57 to be detailed later.

After the estimated time-varying transmittance characteristics C1 are determined as described above, the first wafer 25 is moved to the exposure start position by causing the wafer stage 27 to move in step S9 shown in FIG. 4. Then, the pattern is transferred onto the wafer 25. Part of the pattern on the reticle 16 is selectively illuminated through the variable field stop (reticle blind) 12. By driving the reticle stage 18, the reticle 16 is moved relative to the illumination area defined by the variable field stop 12 from the position which is set as the exposure start position in conformance to the outline of the wafer 25. In synchronization with the movement of the reticle stage 18, the wafer stage 27 is driven to move the wafer 25 relative to the projection area which is conjugate with the illumination area relative to the projection optical system 23. The transfer achieved through this process is a so-called scanning transfer (step-and-scan method). It is to be noted that the embodiment may adopt the step-and-repeat method in which the entire surface of the pattern area on the reticle 16 is transferred onto the wafer at once, without scanning the reticle 16, instead.

Figure 5:
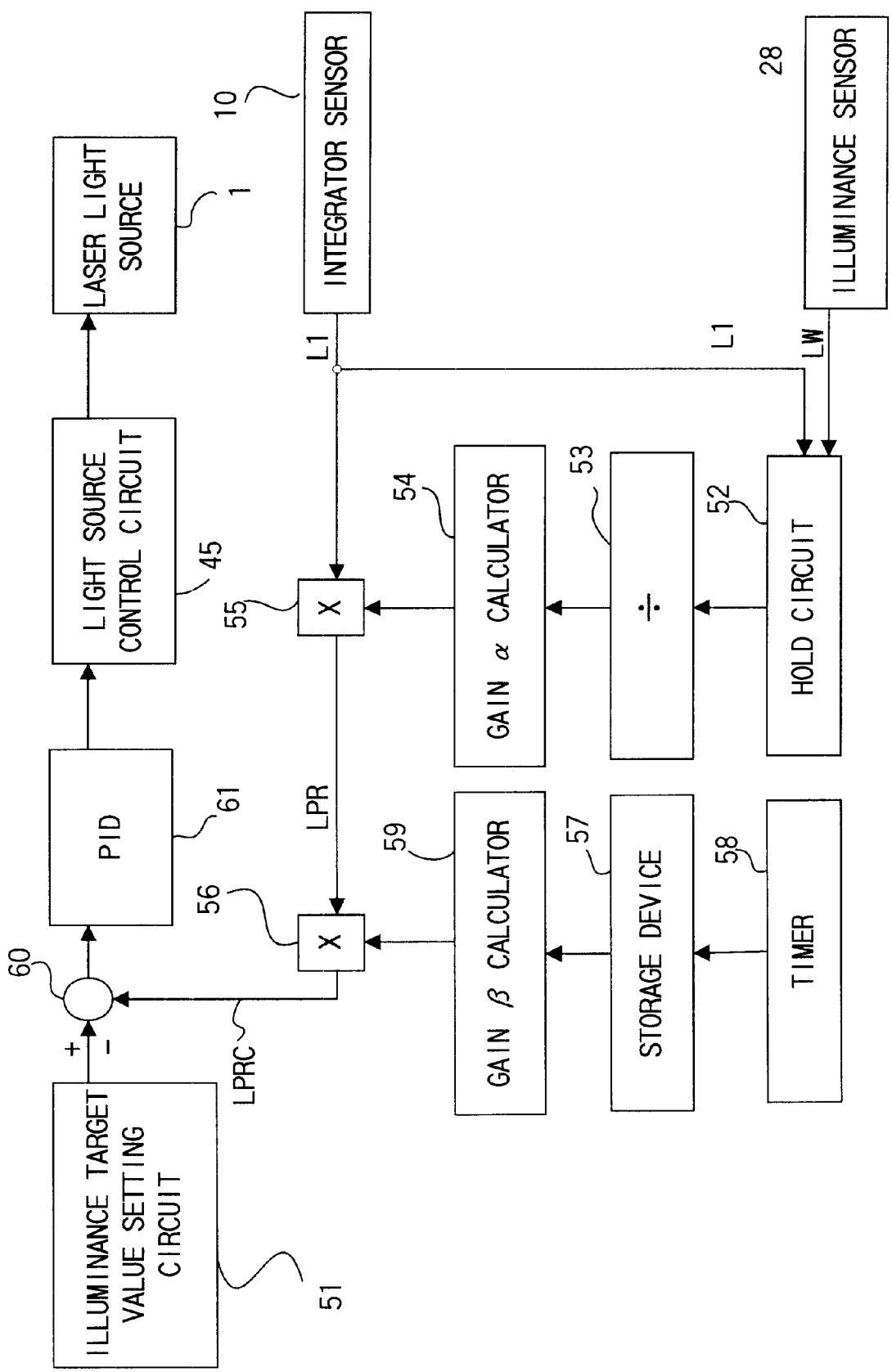
FIG. 5 is a block diagram of the feedback system employed to control the exposing light on the wafer at a target illuminance value.

FIG. 5 is a block diagram illustrating a structure that is adopted to implement feedback control on the intensity of the laser light at a target illuminance on the wafer according to the present invention. The individual circuits including the light source control circuit 45 mentioned earlier may be provided, for example, in the form of software or hardware within the control circuit 40. The target illuminance on the wafer, which is determined in correspondence to the resist sensitivity characteristics and the like, is set at a target value setting circuit 51. d (unit; dgt) representing the control value to be used to achieve the target illuminance may be expressed in the following formula (4).

$$d = D/(a \cdot Cm/K_a) \quad (4)$$

with

D: exposure quantity setting (unit: mJ/cm$^2$), a: exposure quantity conversion coefficient (unit: mJ/cm$^2$/dgt), Cm: estimated time-varying transmittance characteristics (estimated transmittance) manifesting when exposing mth wafer and $K_a$: standard lens transmittance.

In FIG. 5, the integrator sensor 10 outputs the detection signal LI which corresponds to the illuminance of the exposing light made consistent by the fly-eye lens 6 as explained above. The illuminance sensor 28 outputs the detection signal LW that corresponds to the illuminance of the exposing light on the wafer stage 27. Prior to the start of an exposure operation, the illuminance sensor 28 is moved onto the optical axis AX of the projection optical system 23, and the measured value LI at the integrator sensor 10 and the measured value LW at the illuminance sensor 28 are held at a sample hold circuit 52.

The ratio of the detection signal LI from the integrator sensor 10 and the detection signal LW from the illuminance sensor 28 (output LW from sensor 28/output LI from sensor 10) is calculated at a divider 53, and a gain a calculator 54 calculates a gain a by multiplying LW/LI by a specific coefficient K1. Then, during the exposure operation, a multiplier 55 multiplies the output signal from the integrator sensor 10 by the gain α and outputs an estimated actual illuminance LPR. In other words, when it is assumed that the measured value at the integrator sensor 10 is 100 and the illuminance on the wafer is 50 at the start of the exposure, for instance, the estimated actual illuminance LPR represents an estimated value of the illuminance on the wafer achieved by multiplying the gain α, which has been calculated by multiplying the ratio 50/100 by the specific coefficient K1, by the signal output from the integrator sensor 10 during the exposure. Hence, the gain α is set as an optimal value for a situation in which there is no fluctuation in the transmittance.

The estimated actual illuminance LPR calculated by multiplying the detection signal from the integrator sensor 10 by the gain α at the multiplier 55 is further multiplied by a gain β at a multiplier 56, to calculate a corrected estimated actual illuminance LPRC on the wafer. The gain β is calculated as described below. As explained earlier, the estimated time-varying transmittance characteristics determined in advance are stored in the storage device 57. A timer 58 measures the period of time elapsed after the start of exposure, and the storage device 57 is accessed to read out the transmittance in correspondence with the length of the measured time. The results of the readout are input to a gain β' computing unit 59, which multiplies the transmittance read out by a specific coefficient K2 to calculate the gain β. For instance, when the transmittance is 80%, the gain β is set at 0.8×K2.

The signal LPRC achieved by multiplying the detection signal from the integrator sensor 10 by the gains α and β indicates an estimated value of the actual illuminance on the wafer stage 27, and is input to a deviation calculator 60. The deviation calculator 60 calculates the deviation between the target illuminance on the wafer output by the target value setting circuit 51 and the corrected estimated actual illuminance, inputs the deviation thus calculated to a PID arithmetic circuit 61 to perform a PID operation and sends the results of the PID operation to the light source control circuit 45 to control the light source 1, i.e., adjust its oscillation intensity. Through the feedback control explained above, the oscillation intensity at the laser light source 1 is adjusted so as to sustain the estimated actual illuminance LPRC on the wafer 25 at a constant level unaffected by changes in the transmittance that may occur at the optical system after the exposure start.

Assuming that a pattern image is currently projected on the wafer 25 between the time points td1A~t1A in FIG. 3, the exposure quantity required during the exposure operation performed between the time points td1A~t1A is calculated by using the estimated characteristics C1 based upon the period of time elapsed during this period (exposure time).

Figure 6:
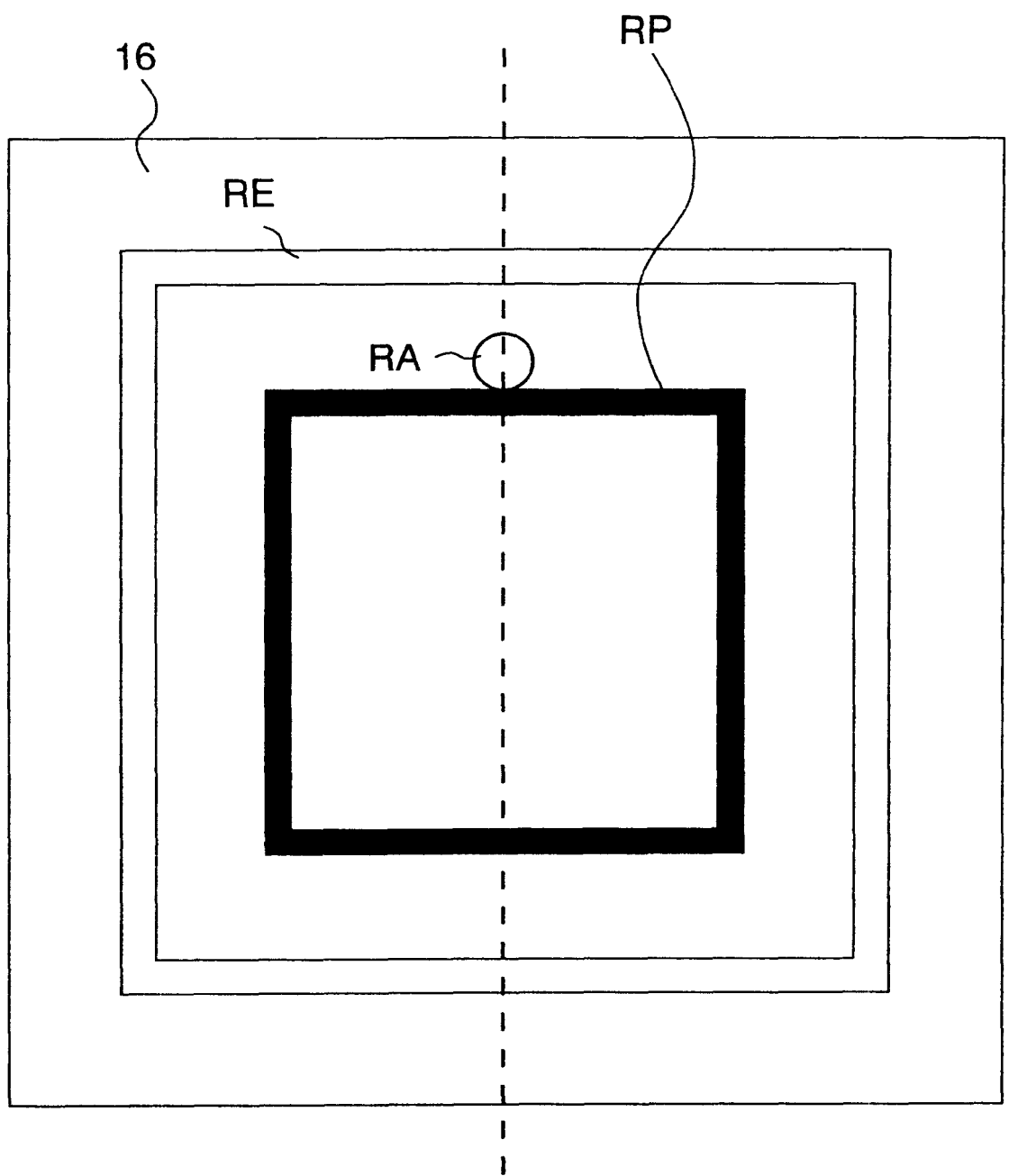
FIG. 6 is a plan view of a reticle provided with a pericle in which a transparent area for measurement is formed.

When the exposure of the first wafer 25 is completed in step S9 (the time point t1A shown in FIG. 3) shown in FIG. 4, the transmittance K1A is calculated in steps S10~S12 based on the illuminance ratio LW/LI of the illuminances detected by the integrator sensor 10 and the illuminance sensor 28 at the time point: t1A after the exposure of the first wafer 25 is completed, by emitting laser light for transmittance measurement as in steps S2~S4 explained earlier. The transmittance K1A thus calculated is stored at the storage device 57 before the operation proceeds to step S13. When detecting the illuminances in steps S10~S12, the illuminance on the wafer stage 27 is measured with the illuminance sensor 28 moved to a position which is conjugate with a measurement window RA provided on the outside of a pattern area RP at the reticle 16 relative to the projection optical system 23, as shown in FIG. 6.

In step S13, a decision is made as to whether or not a specific period of time has elapsed since the start of the processing shown in the flow chart in FIG. 4. If a negative decision is made in step S13, the operation proceeds to step S14 to replace the first wafer 25 with the next wafer 25 before returning to step S2. If, on the other hand, an affirmative decision is made in step S13, the operation proceeds to engage in control without a dummy irradiation, which is to be detailed later, and is shown in the flow chart in FIG. 8.

The transmittance K1A at the optical system measured in steps S10~S12 is obtained to be used for the control without dummy irradiation implemented after the processing in the flow chart in FIG. 4 is completed.

Since a transferred pattern is present at least on the wafer 25 at the time of a second or subsequent pattern transfer onto the wafer 25, the position of a mark added to the pattern that has already been transferred onto the wafer 25 is measured by employing a wafer alignment system (not shown). Namely, the position of the mark added in the pattern on the wafer 25 is measured and, based upon the results of the measurement, the positions of the reticle stage 18 and the wafer stage 27 are controlled to achieve a specific positional relationship between the pattern that has already been transferred onto the wafer 25 and the pattern that is to be transferred. It is to be noted that the estimated time-varying transmittance characteristics shown in FIG. 3 correspond to a short-term fluctuation of the transmittance attributable to the degradation of the glass material constituting the optical system shown in FIG. 13.

Control without Dummy Irradiation

Figure 7:
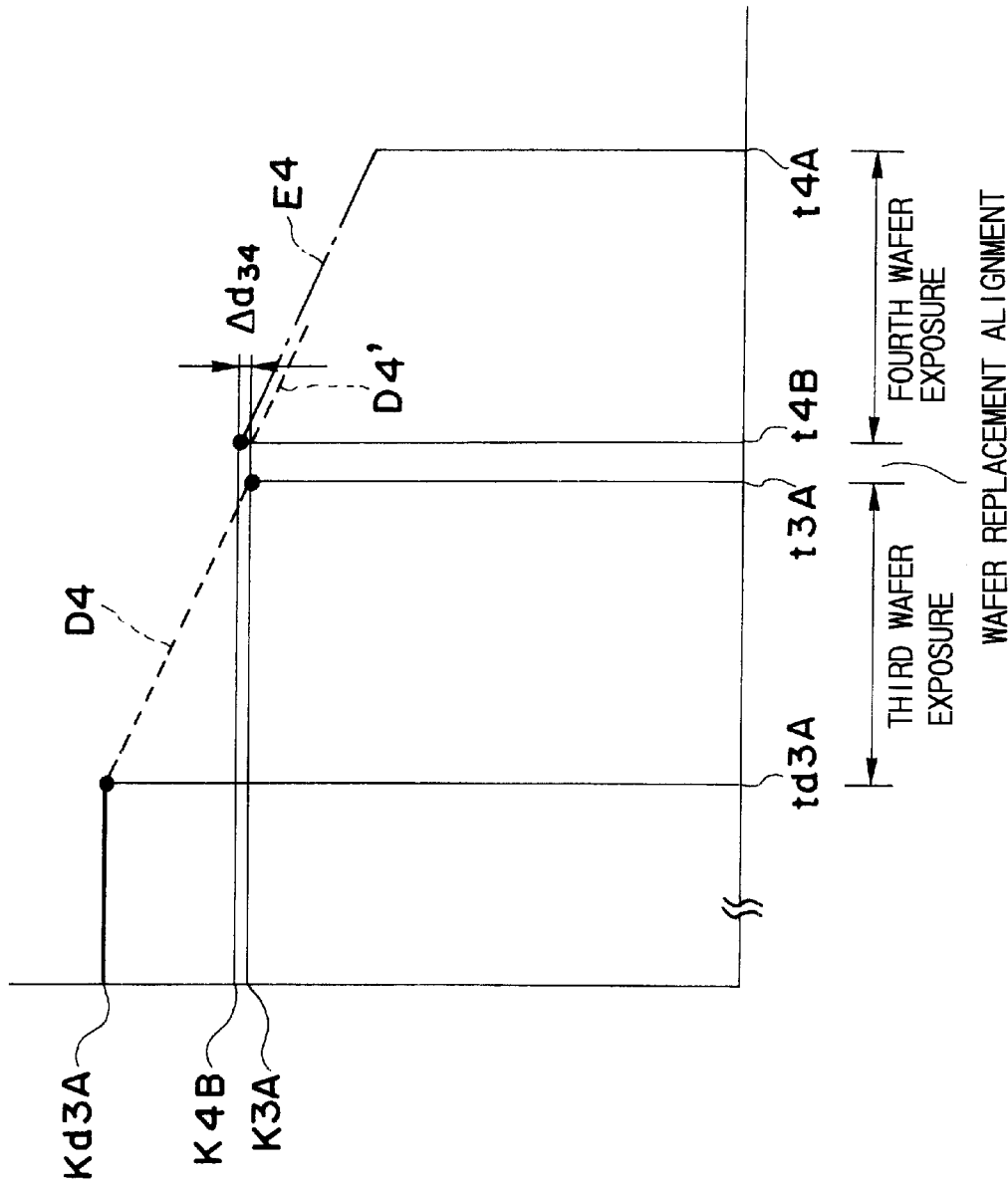
FIG. 7 is an enlargement of the third and fourth wafers shown in FIG. 3.

If an affirmative decision is made in step S13 shown in FIG. 4, i.e., if it is decided that the specific period of time has elapsed since the start of the processing in the flow chart in FIG. 4, estimated time-varying transmittance characteristics (time-varying transmittance characteristics) of a transmittance measurement optical system indicated by reference number E4 shown in FIG. 7 are calculated before starting the next exposure process. FIG. 7 shows, in an enlargement, the portion corresponding to the third and fourth wafers in characteristics presented in FIG. 3.

If, for instance, it is decided that the specific period of time mentioned above has elapsed following the completion of the exposure processing on the third wafer 25, a transmittance Kd3A at a time point: td3A after the dummy irradiation performed prior to the exposure of the third wafer 25 and a transmittance K3A at a time point: t3A after the exposure of the third wafer 25 are ascertained, and estimated time-varying transmittance characteristics D4 used in the exposure of the fourth wafer 25 are calculated by connecting the two transmittances Kd3A and K3A thus obtained with a straight line.

In the control achieved by implementing dummy irradiation, a dummy irradiation for one shot is performed immediately before exposing the first or second wafer 25 and estimated time-varying transmittance characteristics are calculated based upon the transmittances measured before and after the dummy irradiation. In other words, when exposing the first or second wafer 25, estimated time-varying transmittance characteristics are obtained immediately before the exposure process, and thus, it is not necessary to take into consideration the period of time required for replacing the wafer 25. In addition, since no exposing light is irradiated at the optical system while the exposure area of the wafer 25 is moved onto the optical axis of the projection optical system 23 in place of the illuminance sensor 28 positioned on the optical axis of the projection optical system 23 during the dummy irradiation, any changes occurring in the transmittance in the glass material constituting the optical system during this interval can be disregarded.

However, if no dummy irradiation is implemented, the estimated time-varying transmittance characteristics D4 for the exposure of the fourth wafer 25, for instance, cannot be used directly. Namely, allowance must be made for the time required to replace the third wafer with the fourth wafer and to align the fourth wafer 25. Under these circumstances, the transmittance of the optical system may fluctuate (the transmittance may be restored) while the third wafer is being replaced with the fourth wafer and the fourth wafer is being aligned. When controlling the power level of the irradiation on the fourth wafer 25 by using the calculated estimated characteristics D4, fluctuations in the transmittance occurring while replacing the third wafer 25 with the fourth wafer 25 and aligning the position of the fourth wafer 25 must be taken into consideration.

After replacing the third wafer with the fourth wafer 25 and aligning the fourth wafer 25, the illuminance sensor 28 is set on the optical axis AX of the projection optical system 23 by moving the wafer stage 27. A transmittance K4B at a time point: t4B prior to the exposure of the fourth wafer 25 is measured by emitting laser light for transmittance measurement. Estimated characteristics D4' having the same angle of inclination as the estimated characteristics D4 are calculated at the time point: t4B and the difference Δd34 between the transmittance K4B at the time point: t4B and the transmittance K3A at the time point: t3A is ascertained. The estimated characteristics D4' are then corrected in correspondence to the difference Δd34, by shifting them in the upward direction if the transmittance K4B is higher than the transmittance K3A but by shifting them in the downward direction if the transmittance K4B is lower than the transmittance K3A, to calculate estimated characteristics E4 through the following formula (5).

$$E4=(K3A-Kd3A)\cdot X/3Sw+K4B \qquad (5),$$

with 3Sw: number of exposure pulses irradiated on the third wafer.

After the estimated time-varying transmittance characteristics E4 are calculated, an exposure operation starts with a specific area of the fourth wafer 25 set to face opposite the projection optical system 23 by driving the wafer stage 27. The pattern at the reticle 16 is transferred onto the fourth wafer 25 while implementing control on the laser light emission intensity so as to sustain the power of the light from the laser light source 1 which is irradiated onto the wafer 25 at a constant level by using the estimated characteristics E4 thus calculated. When the exposure of the fourth wafer 25 is completed, the illuminance sensor 28 is positioned on the optical axis AX of the projection optical system 23 by moving the wafer stage 27. A transmittance K4A at a time point: t4A after the exposure of the fourth wafer 25 is then measured by emitting laser light for transmittance measurement. Next, after the wafer 25 is replaced with the fifth wafer 25 and the fifth wafer 25 is aligned, the illuminance sensor 28 is moved onto the optical axis AX of the projection optical system 23 and a transmittance K5B at a time point: t5B preceding the exposure of the fifth wafer 25 is measured by emitting laser light for transmittance measurement. Estimated time-varying transmittance characteristics E5 used in the exposure of the fifth wafer 25 are calculated through the following formula (6) based upon the transmittances K4B and K4A at the time points: t4B and t4A before and after exposing the fourth wafer 25 and the transmittance K5B at the time point: t5B prior to the exposure of the fifth wafer 25, and an exposure operation of the fifth wafer 25 is performed as in the exposure operation on the fourth wafer 25 explained earlier.

$$E5=(K4A-K4B)\cdot X/4Sw+K5B \qquad (6)$$

with 4Sw: the number of exposure pulses irradiated on the fourth wafer.

A calculation formula used to calculate estimated time-varying transmittance characteristics En used in the exposure of an nth wafer 25 is expressed as in the following expression (7).

$$En=(K(n-1)A-K(n-1)B)\cdot X/(n-1)Sw+KnB \qquad (7),$$

with

K(n−1) A: transmittance at time point t(n−1)A after exposing (n−1)th wafer 25,

K(n−1) B: transmittance at time point t(n−1)B before exposing the (n−1)th wafer 25, (n−1)Sw: number of exposure pulses irradiated on (n−1)th wafer 25 and KnB: transmittance at a time point tnB before exposing nth wafer 25.

When the control is implemented without dummy irradiation, the transmittance is measured by taking in the illuminances of the exposing light at the integrator sensor 10 and the illuminance sensor 28 in synchronization with the laser pulse and calculating the ratio LW/LI of the output LI from the integrator sensor 10 and the output LW from the illuminance sensor 28 corresponding to the illuminances thus taken in, as in the measurement performed in conjunction with the control achieved by performing dummy irradiation.

Figure 8:
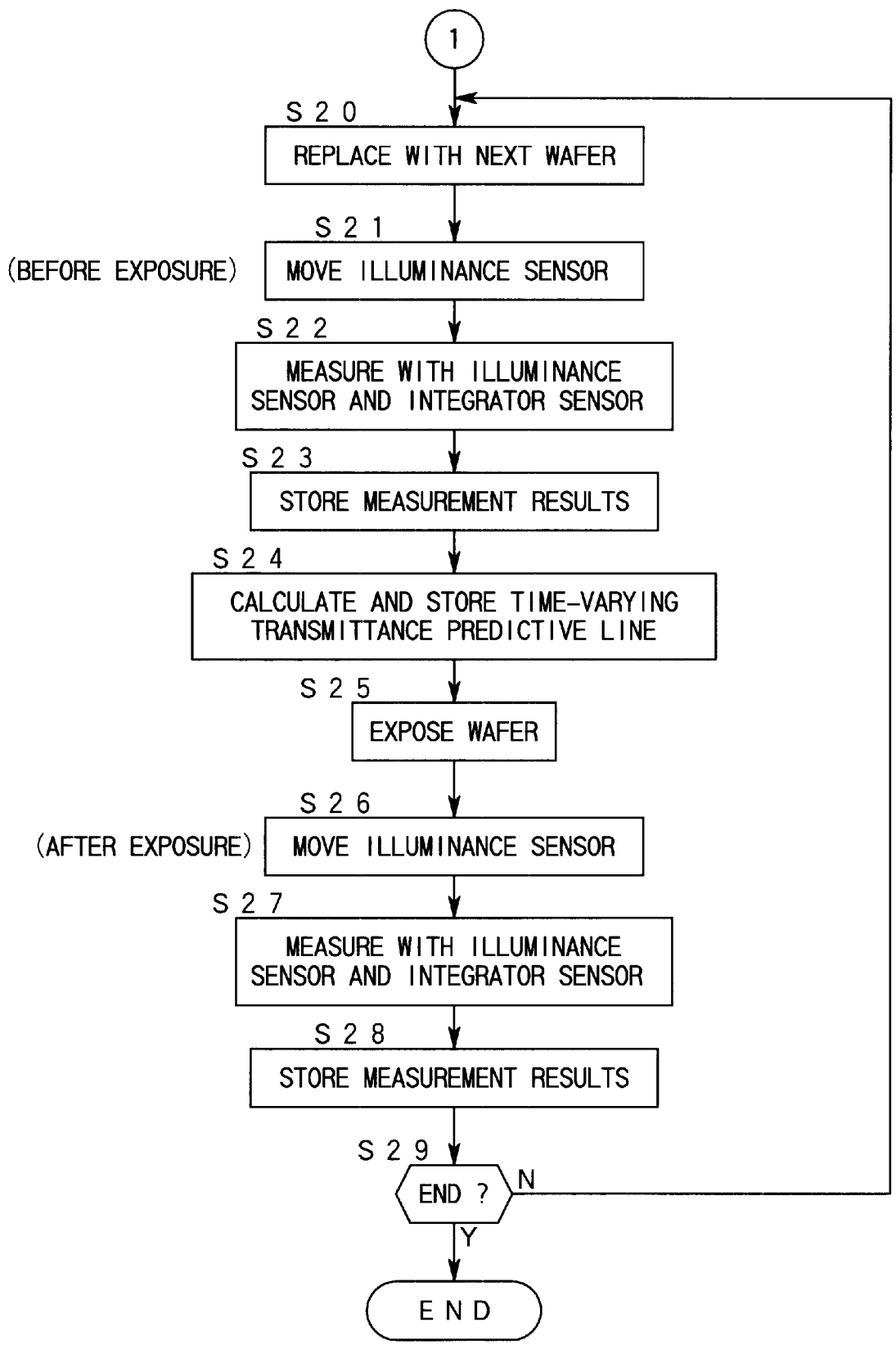
FIG. 8 is a flow chart of the procedure for implementing exposure by calculating time-varying transmittance characteristics based upon the transmittances before and after exposing the (n−1)th wafer and the transmittance before exposing the nth wafer.

FIG. 8 is a flow chart of the procedure in which exposure is performed by calculating time-varying transmittance characteristics based upon the transmittances measured before and after exposing the (n−1)th wafer 25 and the transmittance measured before exposing the nth wafer 25. This procedure is implemented continuously following the control procedure in the flow chart shown in FIG. 4 implemented in conjunction with the dummy irradiation explained earlier. In step S20, the wafer is replaced and the next wafer 25 is aligned. In step S21, the wafer stage 27 is moved so as to position the illuminance sensor 28 on the optical axis AX of the projection optical system 23. In addition, the window RA for illuminance measurement provided on the reticle 16 is aligned at a position which is conjugate with the illuminance sensor 28 relative to the projection optical system 23 by moving the reticle stage 18. In step S22, laser light for transmittance measurement is emitted by driving the laser light source 1, to detect the illuminance LI of the exposing light reflected by the mirror 9 with the integrator sensor 10 and detect the illuminance LW of the exposing light on the wafer stage 27 with the illuminance sensor 28 (pre-exposure measurement). Based upon the value of the illuminance LI detected by the integrator sensor 10, the ND filter achieving the optimal transmittance, the number of shots and the speed at which the reticle stage 18 is to travel are determined. In step S23, the results of the detection of the illuminances LI and LW are stored as the illuminances detected before the exposure.

In step S24, based upon the illuminances detected before and after exposing the (n−1)th wafer 25 stored in advance at the storage device 57 and the illuminances detected before exposing the nth wafer 25 stored in step S23, estimated time-varying transmittance characteristics En used in the exposure of the nth wafer 25 are calculated, and these estimated characteristics En are stored as a linear function. Alternatively, the estimated characteristics En may be stored at the storage device 57 in the form of a table of the transmittance relative to the length of exposure time.

When the estimated characteristics En are stored at the storage device 57, the operation proceeds to step S25 in which an exposure operation starts with a specific area of the nth wafer 25 set to face opposite the projection optical system 23 by driving the wafer stage 27. Since the estimated characteristics En that have been calculated are stored at the storage device 57, the timer 58 shown in FIG. 5 measures the length of time having elapsed since the exposure start and the transmittance is read out by accessing the storage device 57 in correspondence to the period of time thus measured. The transmittance thus read out is then input to the gain β calculator 59 in the feedback control explained earlier, and the gain β calculator 59 calculates the gain β by multiplying the transmittance that has been read out with a specific coefficient K2. Through the processing described above, the pattern is transferred onto the nth wafer 25. This transfer may be implemented either through the step-and-scan method or the step-and-repeat method mentioned earlier.

A target control value d(unit; dgt) set at the target value setting circuit 51 shown in FIG. 5 is expressed as in the following formula (8).

$$d=D/(a\cdot En/K_a) \qquad (8),$$

with

D: exposure quantity setting (unit; mJ/cm$^2$), a: exposure quantity conversion coefficient (unit; mJ/cm$^2$/dgt), En: estimated time-varying transmittance characteristics (estimated transmittance) used in the exposure of nth wafer and $K_a$: standard lens transmittance.

When the exposure of the wafer 25 is completed, the wafer stage 27 is moved so as to set the illuminance sensor 28 on the optical axis AX of the projection optical system 23 in step S26. In addition, the window RA for illuminance measurement provided on the reticle 16 is aligned at a position which is conjugate with the illuminance sensor 28 relative to the projection optical system 23 by moving the reticle stage 18. In steps S27 and S28, transmittance KnA is calculated as the illuminance ratio LW/LI of the illuminances detected by the integrator sensor 10 and the illuminance sensor 28 at a time point: tnA after exposing the wafer 25 by emitting laser light for transmittance measurement (post-exposure measurement) as in steps S22 and S23 explained earlier, and after the transmittance KnA is stored in memory, the operation proceeds to step S29.

In step S29, a decision is made as to whether or not measurement has been completed for all the wafers 25. If a negative decision is made in step S30*[2], the operation returns to step S20 to engage in the processing on the next wafer 25. If, on the other hand, an affirmative decision is made in step S29, the processing in the flowchart shown in FIG. 8 ends.

The features of the first embodiment are summarized.

(1) Dummy irradiation is performed before exposing an mth wafer 25 and the accumulated exposure quantity on the surface of the wafer 25 is controlled by obtaining estimated time-varying transmittance characteristics Cm used in the exposure of the wafer 25 based upon the transmittances measured before and after the dummy irradiation. As a result, since the transmittance during an exposure operation can be estimated based upon the change occurring in the transmittance during the dummy irradiation performed immediately before the exposure operation when the transmittance changes greatly (e.g., within a specific period of time following a startup of the exposure apparatus which has been in a stopped state over an extended period of time), the error in the estimated transmittance is minimized to enable more accurate exposure quantity control.

(2) For the (m+1)th and subsequent wafers (when the transmittance does not change as much, as after the specific period of time has elapsed following the startup of the exposure apparatus), a transmittance Dn estimated based upon the transmittances measured before and after exposing the (n−1)th wafer 25 is corrected in conformance to the difference Δd between the transmittance K(n−1)A manifesting after exposing the (n−1)th wafer 25 and the transmittance KnB before exposing the nth wafer 25 following the wafer replacement and the alignment, to calculate estimated time-varying transmittance characteristics En. With the total exposure quantity to be achieved when exposing the nth wafer 25 controlled by using the estimated characteristics En, more accurate exposure quantity control is achieved by minimizing the error in the estimated transmittance even when the transmittance changes while replacing the wafer 25 and aligning the new wafer.

(3) By implementing the control described in (1) above until the specific period of time elapses after the time point: td1B at which the first pulse emission is implemented on the first wafer 25 and implementing the control described in (2) above after the specific period of time elapses, advantages are achieved in that the throughput is not lowered due to the lengthened processing time which would result if the dummy irradiation were performed each time the wafer 25 was replaced and in that the degree to which the optical system including the laser light source becomes degraded due to the increase in the number of light emissions attributable to the dummy irradiations is minimized.

(4) Since the reticle stage 18 is moved during the dummy irradiation when implementing the control in (1) above, the transmittance at the projection optical system 23 during the dummy irradiation is made to fluctuate in a manner similar to that with which the transmittance at the projection optical system 23 fluctuates while exposing the wafer 25, to achieve more accurate exposure quantity control.

While the specific period of time during which the control is implemented in conjunction with dummy irradiation extends from the time point: td1B at which the first pulse emission is performed before the dummy irradiation implemented prior to the exposure of the first wafer 25 until the end of the exposure processing on the third wafer 25 in the explanation given above, this specific period may be set freely. For instance, if the transmittance fluctuates only to a lesser degree compared to the estimated transmittance fluctuation during the dummy irradiation performed before the exposure processing on the first wafer 25, exposure quantity control may be implemented on the second and subsequent wafers 25 without performing dummy irradiation prior to the exposure processing. In addition, if the change in the transmittance occurring during the dummy irradiation performed before the exposure processing on the third wafer 25 follows a similar pattern as the changes in the transmittance occurring during the dummy irradiations on the first and the second wafers 25, a dummy irradiation may be performed before exposing the fourth wafer 25, as well, to implement the exposure quantity control in conjunction with the dummy irradiation on the fourth wafer 25. Control performed in conjunction with dummy irradiation may be implemented on all the wafers 25, as well.

Furthermore, while the count of the specific period of time starts at the time point: td1B at which the first pulse emission is performed prior to the dummy irradiation performed before exposing the first wafer 25 the count may start at a time point at which the exposure processing resumes if the exposure processing described above is interrupted and the exposure apparatus remains in a stopped state over a period of time longer than a preset period.

The illuminance of the illuminating light on the wafer stage 27 is measured by the illuminance sensor 28 with the illuminating light passing through the window RA for measurement provided on the outside of the pattern area RP at the reticle 16 shown in FIG. 6 when detecting the illuminances in steps S10~S12, steps S21~S23 and steps S26~S28 as described earlier. Alternatively the illuminance on the wafer stage 27 may be detected by allowing the illuminating light to pass through an opening window for measurement provided on the reticle stage 18.

In addition, while the estimated time-varying transmittance characteristics Cm are calculated by connecting the two transmittances measured before and after a dummy irradiation and feedback control is implemented to set the laser light intensity on the wafer 25 at the target illuminance by using the estimated characteristics Cm through the control implemented in conjunction with the dummy irradiation described above, the transmittance may also be measured during the dummy irradiation to use the transmittances measured at three or more time points, i.e., before the dummy irradiation, during the dummy irradiation and after the dummy irradiation. Since the illuminance sensor 28 is set on the optical axis of the projection optical system during a dummy irradiation, the transmittance can be measured even during the dummy irradiation. By using the transmittances measured at three or more time points, the accuracy of the estimated characteristics is improved. The method of approximation is not limited to linear approximation, and a regression line or a regression curve that does not directly connect the calculated transmittances may be used instead. Any of various approximation methods such as polynomial approximation, power approximation, exponential approximation and corrected exponential approximation may be adopted.

A transmittance Kd1M at a time point: td1M during a dummy irradiation is obtained by taking in the output LI from the integrator sensor 10 and the output LW from the illuminance sensor 28 in synchronization with the emitted pulse at the time point: td1M during the dummy irradiation implemented to emit 100 pulses and calculating the illuminance ratio LW/LI.

While the estimation is made through linear approximation when estimating the transmittance during the exposure operation in correspondence to the two transmittances measured before and after the dummy irradiation, a estimation can be made through curve approximation based upon the transmittances measured at three or more time points by measuring the transmittance during the dummy irradiation as well, as explained above.

It is to be noted that while the number of shots in a dummy irradiation is set at 1 in the explanation above, the number of shots for the subsequent dummy irradiation may be increased if the error in the estimated transmittance characteristics Cm obtained through expression (3) is significant and the exposure quality resulting from the exposure of the wafer 25 is not up to a specific standard.

Figure 13:
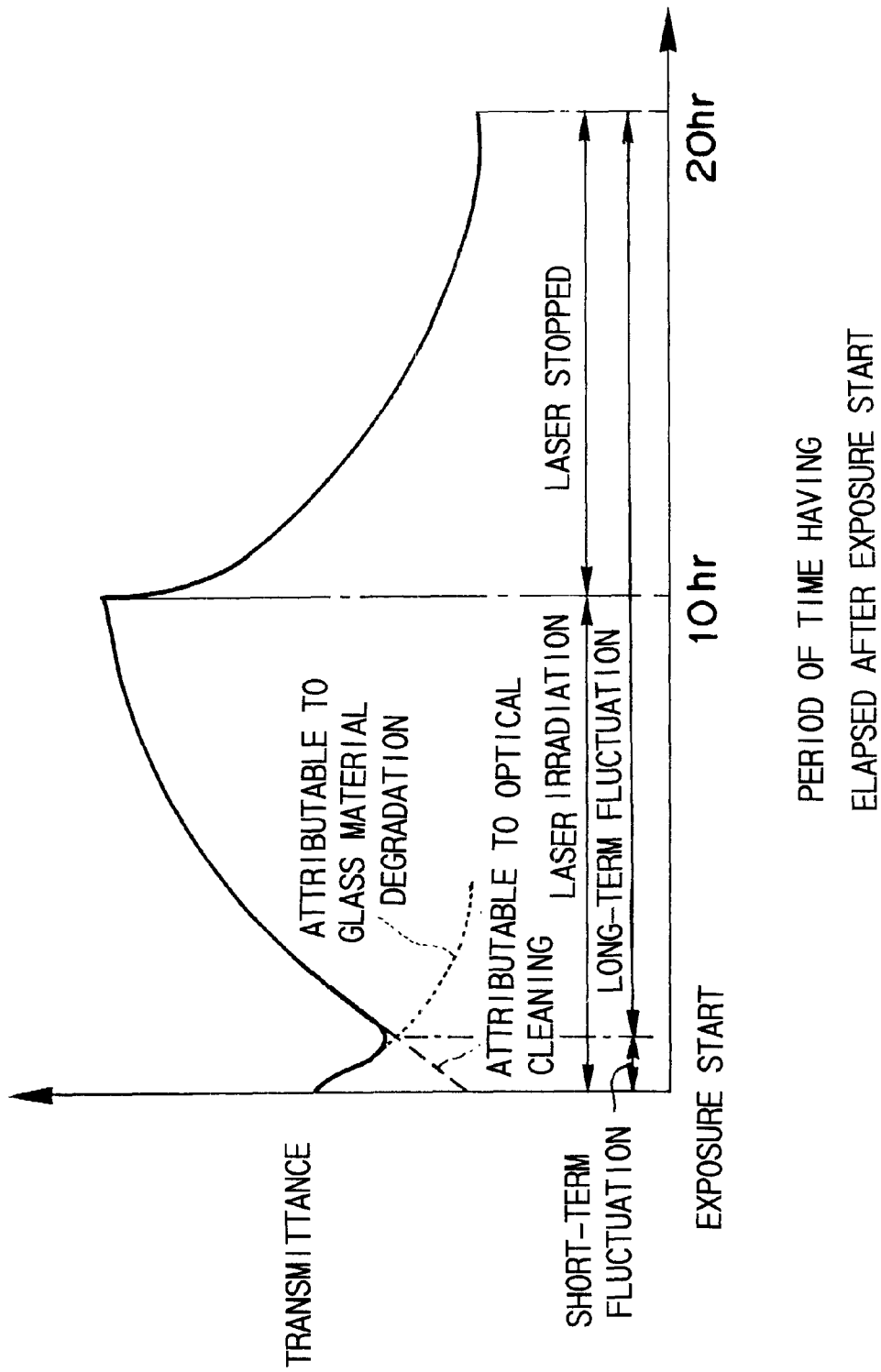
FIG. 13 presents an example of time-varying transmittance characteristics manifesting at an optical system.

Moreover, while the exposure quantity control implemented over the interval in which the transmittance becomes lowered in the time-varying transmittance characteristics at the projection optical system 23 shown in FIG. 13 is explained above, the exposure quantity may be controlled without performing dummy irradiation over the interval during which the transmittance recovers.

Second Embodiment

During the control implemented in conjunction with dummy irradiation, estimated characteristics Fm calculated by multiplying the estimated time-varying transmittance characteristics Cm, which has been calculated by connecting the two transmittances measured before and after the dummy irradiation, by a specific coefficient may be used to achieve feedback control to set the laser light intensity on the wafer 25 at the target illuminance.

Figure 9:
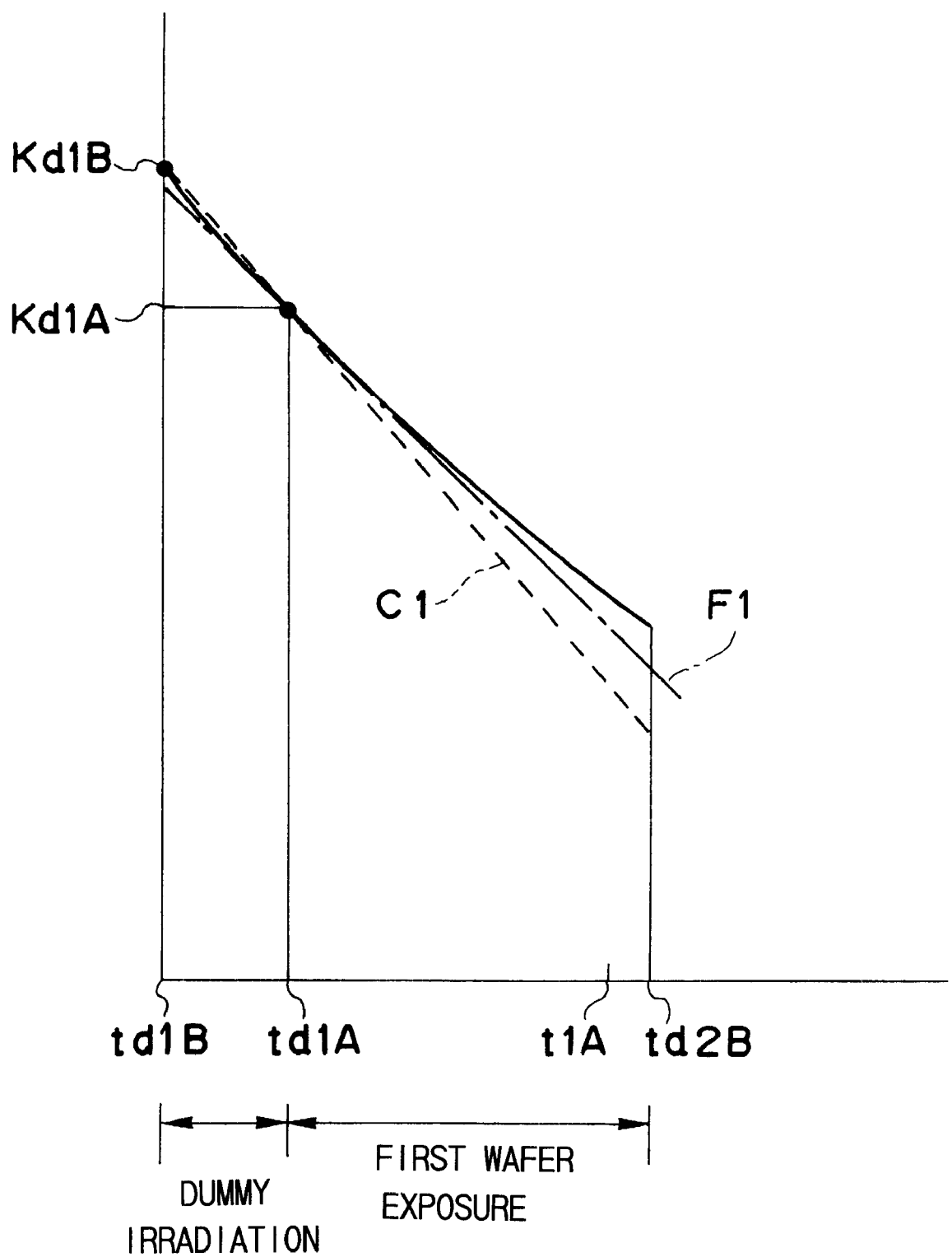
FIG. 9 is an enlargement of the first wafer shown in FIG. 3.

FIG. 9 is an enlargement of the portion corresponding to the first wafer 25 in the graph in FIG. 3. When the laser emission has been in progress for a short period of time after the start of the exposure processing, the transmittance tends to change greatly over time as indicated by the solid line in FIG. 9. Under these circumstances, if the transmittance during the exposure of the first wafer 25 is estimated based on the estimated characteristics C1 calculated by connecting the two transmittances, i.e., the transmittance Kd1B measured before the dummy irradiation and the transmittance Kd1A measured after the dummy irradiation as in the first embodiment, the risk of an increase in the error representing the difference between the estimated characteristics C1 indicated by the dotted line and the actual change in the transmittance indicated by the solid line arises. In such a case, the estimated transmittance is lower than the actual transmittance, and over-exposure occurs. Accordingly, if the inclination of the estimated characteristics C1 is greater than a specific value, estimated transmittance characteristics F1 used in the exposure of the first wafer 25 are calculated through the following formula (9) in which the first term in expression (1) is multiplied by a coefficient k equal to or smaller than one.

$$F1 = (Kd1A - Kd1B) \cdot X \cdot k / 1stS + Kd1A \qquad (9),$$

with $k \leq 1$.

While the value of the coefficient k is normally set at 1, the coefficient k may be set at k=0.8, for instance, if the inclination indicated by the first term in expression (9) above is equal to or greater than the specific value. This sets the transmittance estimated in conformance to the estimated characteristics F1 indicated by the one-point chain line closer to the actual transmittance compared to the estimated transmittance obtained based upon the estimated characteristics C1. Based upon expression (9) above, the following formula (10) for obtaining the estimated characteristics Fm for the mth wafer 25 is obtained.

$$Fm = (KdmA - KdmB) \cdot X \cdot k / mstS + KdmA \qquad (10),$$

The feature of the second embodiment is summarized. Since the transmittance during an exposure operation is estimated in conformance to the estimated time-varying transmittance characteristics Fm obtained by multiplying the inclination of the time-varying transmittance characteristics Cm estimated based upon the transmittances measured before and after the dummy irradiation by the coefficient k equal to or smaller than 1, estimated characteristics with a small inclination are obtained without having to increase the number of shots during the dummy irradiation even when the inclination of the estimated characteristics would otherwise be large due to a great change in the transmittance as is the case immediately after starting up the exposure apparatus which has been in a stopped state over an extended period of time. Consequently, advantages are achieved in that the throughput is not lowered as a result of the lengthened processing time due to an increase in the number of dummy irradiations and in that the degree to which the optical system that includes the laser light source is caused to degrade due to the increase in the number of emissions is minimized. It goes without saying that in the second embodiment, too, linear approximation may be implemented based upon the transmittances measured at two time points or curve approximation may be adopted instead.

Third Embodiment

Figure 10:
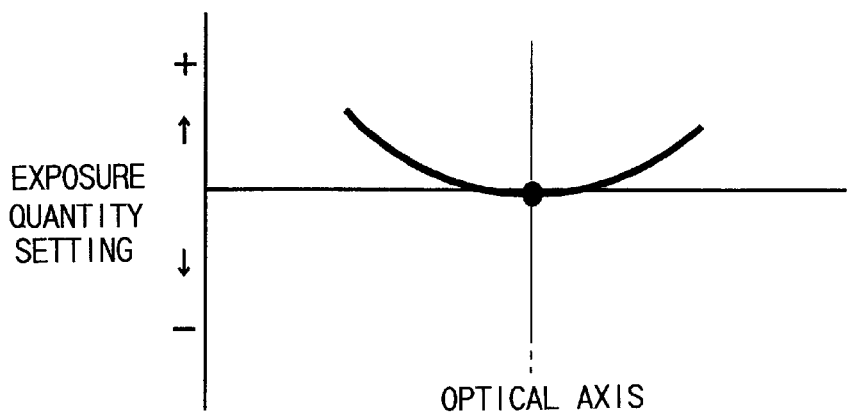
FIG. 10 shows the exposure quantity set when the illuminating intensity is measured at one point on the optical axis AX.

In the third embodiment, an area sensor is utilized to constitute the illuminance sensor 28 to detect the average illuminance in and around the optical axis AX of the projection optical system 23. The transmittance at the transmittance measurement optical system reaches its maximum level on the optical axis AX and becomes slightly lowered outside the optical axis. Thus, if the exposure quantity is controlled through the feedback control shown in FIG. 5 by measuring the illuminance of the exposing light within the illumination area only at one point on the optical axis AX, the exposure quantity is controlled at the exposure quantity setting only in the vicinity of the optical axis AX within the illumination area. FIG. 10 is a graph of the exposure quantity set when implementing the exposure quantity control by measuring the illuminance at one point on the optical axis AX. The horizontal axis represents the displacement from the optical axis AX and the vertical axis represents the exposure quantity setting. The exposure quantity matches the exposure quantity setting on the optical axis AX and the exposure quantity out-side the axis differs slightly from the exposures quantity setting shown in FIG. 10.

Figure 11:
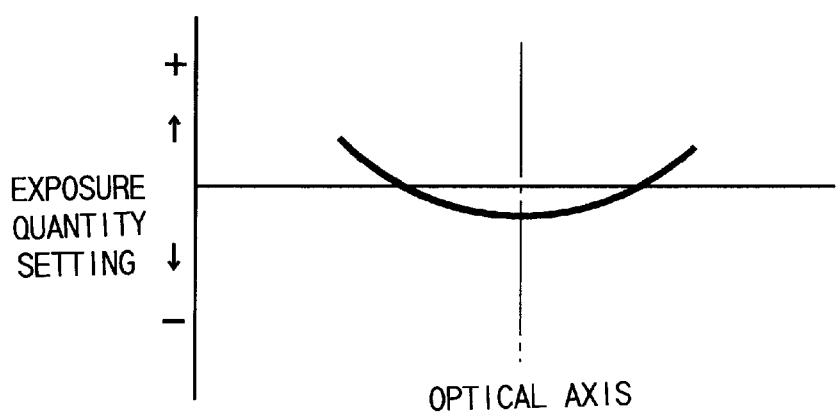
FIG. 11 shows the exposure quantity set when the average illuminating intensity in the illumination area which contains the optical axis AX is measured by employing an area sensor.

By constituting the illuminance sensor 28 with an area sensor having a light-receiving area larger than the illumination area illuminated by the projection optical system 23, the average illuminance of the illuminating light entering the light-receiving surface is detected by the illuminance sensor 28. FIG. 11 presents a graph of the exposure quantity achieved when the average illuminance in the illumination area which contains the optical axis AX is measured by using the area sensor. While the exposure quantity at the optical axis AX is slightly different from the exposure quantity setting, the average of the illuminances over the illumination area is controlled to achieve the exposure quantity setting through the feedback control implemented based upon the average illuminance.

The feature of the third embodiment is summarized. The average illuminance within the illumination area illuminated by the projection optical system 23 is measured by utilizing an area sensor, the time-varying transmittance characteristics to manifest at transmittance measurement optical system are calculated based upon the average illuminance and feedback control of the exposure quantity during an exposure operation is implemented. Thus, in a situation in which the transmittance on the optical axis AX differs from the transmittance outside the axis, it is possible to reduce the deviation of the exposure quantity having undergone the feedback control relative to the exposure quantity setting, compared to the deviation manifesting when implementing feedback control of the exposure quantity by measuring the illuminance within the illumination area at one point on the optical axis AX. As a result, the quality of exposure performed by the exposure apparatus improves.

Figure 12:
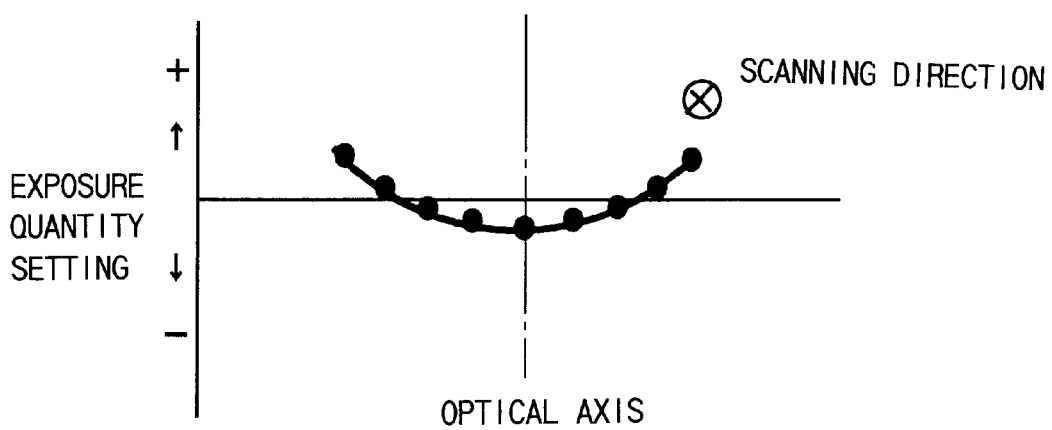
FIG. 12 shows the exposure quantity set when exposure quantity control is implemented by measuring illuminances at nine points within the illumination area including the optical axis AX, based upon the average of the nine measured values.

Instead of utilizing an area sensor, the illuminance sensor 28 employed in the first and second embodiments that detects the illuminance at one point may be used to detect the illuminance inside the illumination area illuminated by the projection optical system 23 at a plurality of points including one on the optical axis AX and those distanced from the optical axis AX over specific intervals along the direction perpendicular to the direction in which the illuminating light is scanned. A graph of the exposure quantity achieved through exposure quantity control implemented based upon the average value of nine measured values obtained by measuring the illuminance inside the illumination area at nine points including one on the optical axis AX is presented in FIG. 12. In FIG. 12, the direction extending toward the inside of the drawing paper is the scanning direction. While the exposure quantity at the optical axis AX is slightly different from the exposure quantity setting, feedback control of the exposure quantity is implemented in conformance to the average illuminance, as in the feedback control implemented by utilizing an area sensor so that the averaging of the illuminances in the illumination area is controlled to achieve the exposure quantity setting.

It is also feasible to allow selection of the exposure quantity control implemented based upon the illuminance detected at one point on the optical axis AX within the illumination area or the exposure quantity control implemented based upon the average illuminance inside the illumination area described above. For instance, when it is necessary to achieve precise control on the exposure quantity at a given point on the wafer 25, i.e., a specific point inside a single chip area, the former exposure quantity control should be selected. This exposure quantity control is effective when handling diverse circuit patterns, as in an ASIC. If, on the other hand, it is necessary to minimize inconsistency in the exposure on the wafer 25, the latter exposure quantity control should be selected. The latter exposure quantity control is effective when handling repetitive patterns as in a DRAM. As a result, it becomes possible to implement optimal exposure quantity control which corresponds to specific application purposes in a single exposure apparatus, and since this eliminates the need for installing different exposure apparatuses for various types of semiconductor elements being manufactured, a reduction in production cost is achieved. In addition, the quality of the exposure achieved through the exposure operation improves.

While an explanation is given above on an example in which the exposure apparatus is provided with a projection optical system, the present invention may also be adopted in a proximity exposure apparatus, which exposes a pattern at the mask onto a substrate by placing the mask and the substrate in contact with each other without employing a projection optical system. In addition, the application in which exposure apparatus is employed is not limited to semiconductor production, and the present invention may be adopted in an exposure apparatus employed in liquid crystal display element production that exposes a liquid crystal display element pattern onto a rectangular glass plate or in an exposure apparatus employed to manufacture thin-film magnetic heads as well. The light source that should be utilized in an exposure apparatus according to the present invention is not limited to a g beam (436 nm) source, an i-beam (365 nm) source, a KrF excimer laser (248 nm), an ArF excimer laser (193 nm) and an $F_2$ laser (157 nm), and any light source that emits light with a wave length within the vacuum ultraviolet range can be utilized. Furthermore, it goes without saying that the magnification at the projection optical system may be set for enlargement as well as for reduction.

The exposure apparatus explained above is provided with a chamber (not shown) that cuts most of the optical path at the illumination optical system from the external air, and dry nitrogen gas (N2) with its oxygen content maintained at an extremely low level is supplied into the entire chamber through piping. The nitrogen gas is also supplied over the entire space inside the lens barrel (the spaces between the plurality of lens elements) at the projection optical system 23 through piping to keep the degree of attenuation of the ultraviolet pulse light on the optical path at a very low level. It is to be noted that the dry nitrogen gas may be supplied by providing a piping at each of the spaces between the lens elements constituting the illumination optical system and the projection optical system. In addition, a reticle chamber may be formed to block the space between the chamber at the illumination optical system and the projection optical system 23, i.e., the space around the reticle stage 18, from the external air and a wafer chamber may be formed to block the space between the projection optical system 23 and the wafer 25, i.e., the space around the wafer stage. 27, from the external air, with dry nitrogen gas supplied into the individual chambers. Alternatively, the dry nitrogen gas may be supplied (made to flow) at all times into the space between the chamber at the illumination optical system and the projection optical system 23 and the space between the projection optical system 23 and the wafer 25 without forming a reticle chamber or a wafer chamber.

If the chambers described above and the lens barrel at the projection optical system 23 achieve a high degree of air tightness, the dry nitrogen gas does not need to be supplied constantly once a complete replacement of the atmosphere is achieved. However, since the fluctuation of the transmittance occurring as a result of water molecules, hydrocarbon molecules and the like originating from various substances (the glass material, the coating material, the adhesive, the paint, the metal, the ceramics and the like) present within the optical path adhering to the surfaces of the optical elements cannot be disregarded, these impurities are removed through a chemical filter and an electrostatic filter while forcibly causing the temperature-controlled nitrogen gas to flow inside the optical path. The supply piping through which the dry nitrogen gas is supplied should be constituted of a substance that does not generate a great deal of impurity gases (or does not induce a great deal of degassing), such as stainless steel or one of various types of fluorine polymers including tetrafluoro-ethylene, tetrafluoroethylene-terfluoro (alkyl vinyl ether) and tetrafluoro-ethylene-hexafluoropropylene copolymer. In addition, an inert gas such as helium (He), argon (Ar), krypton (Kr), xenon (Xe) or radon (Rn) may be used instead of the dry nitrogen gas.

While laser beams from an excimer laser are used as exposing light in the explanation given above, harmonics achieved by, for instance, amplifying light of a single-wavelength in the infrared range or the visible range oscillated from a distributed feedback (DFB) semiconductor laser or a fiber laser with a fibre amplifier doped with erbium (Er) or both erbium and ytterbium (Yb) and using a nonlinear optical crystal to convert the wavelength of the amplified light to a wavelength of ultraviolet light. For instance, if the wavelength of light oscillated from a single-wavelength laser is within a range of 1.544~1.553 μm, the higher harmonic of a wavelength within a range of 193 nm~194 nm, which is eight times the original wavelength, i.e., ultraviolet light having a wavelength which is almost the same as the wavelength of light oscillated by an ArF excimer laser, is obtained. If the wavelength of light oscillated from a single-wavelength laser is within a range of 1.57~1.58 μm, the higher harmonic of a wavelength within a range of 157 nm~158 nm, which is ten times the original wavelength, i.e., ultraviolet light having a wavelength which is almost the same as the wavelength of light oscillated by an F2 laser, is obtained. Furthermore, if the wavelength of light oscillated from a single-wavelength laser is within a range of 1.03~1.12 μm, the higher harmonic of a wavelength within a range of 147 nm~160 nm, which is seven times the original wavelength is obtained, and in particular, if the wavelength of the oscillated light is within a range of 1.09~1.106 μm, by achieving a higher harmonic within the range of 157~158 nm which is seven times the oscillated wavelength, ultraviolet light having a wavelength almost the same as the wavelength of light oscillated by an F2 laser is obtained. The single wavelength oscillation laser employed in such an application may be, for instance, ytterbium-doped fiber laser.

In the exposure apparatus explained above, the plurality of optical elements constituting the illumination optical system are provided within the illumination optical system chamber with their optical axes individually adjusted and the projection optical system 23 is constituted by individually adjusting the optical axes of a plurality of lenses. In addition, the reticle stage constituted of numerous mechanical components is movably provided inside the reticle chamber and the wafer stage constituted of numerous mechanical components is provided on the image plane side of the projection optical system 23. After connecting electrical wiring to the drive components constituting the reticle stage and the wafer stage, an overall adjustment (electrical adjustment, operational adjustment and the like) is implemented, and by evacuating or supplying an inert gas to the illumination system chamber, the projection optical system and the reticle chamber after connecting piping for gas supply to the illumination system chamber, the projection optical system and the reticle chamber, the exposure apparatus described above is manufactured. It is desirable to perform the production work described above within a temperature controlled clean room.

A semiconductor device is manufactured through a step in which the device performance is designed, a step in which a reticle is prepared based upon the design set in the design step, a step in which a wafer is manufactured from a silicon material, a step in which a pattern at the reticle is transferred onto the wafer by employing the exposure apparatus described above, a device assembly step (which includes a dicing process, a bonding process and a packaging process), an inspection step and the like.

What is claimed is:

1. A method for exposure comprising:
   obtaining a first transmittance of an optical system relative to an exposing light before transferring an image of a pattern illuminated with the exposing light via said optical system provided within an optical path of the exposing light onto a first predetermined surface;
   obtaining a second transmittance of said optical system after the image of the pattern is transferred onto said first predetermined surface;
   obtaining a third transmittance of said optical system before transferring the image of the pattern onto a second predetermined surface different from said first predetermined surface; and
   controlling an exposure quantity of the exposing light to said second predetermined surface based upon said first transmittance, said second transmittance and said third transmittance.

2. A method for exposure according to claim 1, wherein:
   for controlling the exposure quantity, time-varying change of optical characteristics of said optical system is estimated based upon said first transmittance and said second transmittance and the estimated time-varying change of the optical characteristics is corrected based upon said third transmittance.

3. A method for exposure according to claim 2, wherein:
   the time-varying change of the optical characteristics is made by correcting said first transmittance and said second transmittance through approximation.

4. A method for exposure according to claim 2, wherein:
   the estimated time-varying change of the optical characteristics is corrected by correcting the difference between said second transmittance and said third transmittance.

5. A method for exposure according to claim 1, wherein:
   said optical system includes an illumination optical system that illuminates a mask at which the pattern is formed and a projection optical system that transfers an image of the pattern onto said first or second predetermined surface.

6. A method for exposure according to claim 1, wherein:
   said first predetermined surface is a photosensitive surface of an (n−1)th substrate, and said second predetermined surface is a photosensitive surface of an nth substrate.

7. A method for exposure according to claim 1, wherein:
   said first transmittance, said second transmittance and said third transmittance are respectively expressed as a ratio of an output from a first light receiver which receives the exposing light before entering said optical system and an output from a second light receiver which receives the exposing light passing through said optical system.

8. A method for exposure according to claim 7, wherein:
   the output from said second light receiver is an information about an average illuminance in an illumination area over which the exposing light passing through said optical system is irradiated on said predetermined surface.

9. A method for exposure according to claim 1, wherein:
   an attenuation rate of the exposing light passing through said optical system is calculated based upon said transmittances.

10. A method for exposure according to claim 1, wherein:
    said transmittances are obtained based upon an output from a first light receiver which receives the exposing light before entering said optical system and an output from a second light receiver which receives the exposing light passing through said optical system.

11. An exposure method for transferring a pattern of a mask onto a predetermined surface with an optical system provided. within an optical path of an exposing light, comprising:

controlling an exposure quantity of the exposing light to the predetermined surface based upon a first estimation sequence for estimating a change of a transmittance of the optical system relative to the exposing light;

estimating the change of the transmittance of the optical system relative to the exposing light based upon a second estimation sequence which is different from the first estimation sequence after controlling the exposure quantity of the exposing light based upon the first estimation sequence for a predetermined period of time; and controlling the exposure quantity of the exposing light to said predetermined surface based upon the estimated change of the transmittance of the optical system.

12. A method for exposure according to claim 11, wherein:

the first estimation sequence includes the exposure quantity control in which the exposure quantity of the exposing light to a first predetermined surface is controlled based upon a first transmittance of said optical system before an image of a pattern is transferred onto said first predetermined surface and a second transmittance of said optical system after the exposing light is irradiated preliminarily on said optical system; and the second estimation sequence includes the exposure quantity control in which the exposure quantity of the exposing light to a third predetermined surface is controlled based upon a third transmittance of said optical system before an image of the pattern is transferred onto a second predetermined surface, a fourth transmittance of said optical system after an image of the pattern is transferred onto said second predetermined surface and a fifth transmittance of said optical system before an image of the pattern is transferred onto said third predetermined surface which is different from said second predetermined surface.

13. A method for exposure according to claim 12, wherein:

in said first estimation sequence, the transmittance of said optical system while said exposing light is irradiated preliminarily on said optical system is measured to control the exposure quantity based upon the transmittance before and after the preliminary irradiation and the transmittance during the preliminary irradiation.

14. A method for exposure according to claim 13, wherein:

said first estimation sequence is implemented until a predetermined period of time elapses after an exposure apparatus starts an exposure operation; and said second estimation sequence is implemented after the predetermined period of time has elapsed.

15. A method for exposure according to claim 13, wherein:

said first estimation sequence is implemented when an exposure apparatus is started up after an exposure operation has been stopped over a predetermined period of time.

16. A method for exposure according to claim 12, wherein:

in said first estimation sequence, the time length of the preliminary irradiation is varied in correspondence to a type of mask at which the pattern is formed.

17. A method for exposure according to claim 12, wherein:

in said first estimation sequence, a light receiver which receives the exposing light on substantially the same plane as the plane of said predetermined surface is provided, said light receiver receives the exposing light via said optical system while moving the mask at which the pattern is formed along a predetermined direction and the exposure quantity achieved with the exposing light at said predetermined surface is controlled based upon the results of light reception at said light receiver before the mask is moved and results of light reception at said light receiver during or after the mask movement.

18. A method for exposure according to claim 12, wherein:

a time period of the preliminary irradiation corresponds to a period of time required to expose at least a single shot area at the photosensitive substrate.

19. A method for exposure according to claim 12, wherein:

said first predetermined surface is a photosensitive surface of a first substrate and said second predetermined surface is a photosensitive surface of a second substrate; and said second transmittance is the same as said third transmittance.

20. An exposure method for transferring a pattern of a mask onto a predetermined surface with an optical system provided within an optical path of an exposing light, comprising:

irradiating the exposing light on the optical system over a predetermined period of time while moving the mask along a predetermined direction before an image of the pattern is transferred onto the predetermined surface; and controlling an exposure quantity achieved with the exposing light at said predetermined surface during the transfer based upon the transmittance of said optical system relative to the exposing light before the exposing light is irradiated on said optical system and the transmittance of said optical system relative to the exposing light after the exposing light is irradiated over the predetermined period of time.

21. A method for exposure according to claim 20, wherein:

a light receiver is provided on substantially the same plane as the plane of said predetermined surface; further comprising:

obtaining the transmittance of said optical system before moving the mask, the transmittance of said optical system while moving the mask and the transmittance of said optical system after moving the mask based upon the results of light reception at said light receiver before moving the mask, the results of light reception at said light receiver while moving the mask and the results of light reception at said light receiver after moving the mask;

estimating a change of the transmittance of said optical system based upon the obtained transmittances; and controlling the exposure quantity achieved with the exposing light based upon the estimated change of the transmittance of said optical system.

22. An exposure apparatus, comprising:

a measuring device that measures a first transmittance of an optical system relative to an exposing light before an image of a pattern illuminated with the exposing light is transferred onto a first predetermined surface via said optical system provided in an optical path of the exposing light, a second transmittance of said optical system after the image of the pattern is transferred onto said first predetermined surface and a third transmittance of said optical system before an image of the pattern is transferred onto a second predetermined surface which is different from said first predetermined surface; and a control circuit, which is connected with said measuring device, that controls an exposure quantity achieved with the exposing light at said second predetermined surface based upon said first transmittance, said second transmittance and said third transmittance.

23. An exposure apparatus employed to transfer a pattern of a mask onto a predetermined surface with an optical system provided within an optical path of an exposing light, comprising:

a storage device that stores in memory a first estimation sequence for estimating a change of a transmittance of said optical system relative to the exposing light and a second estimation sequence, which is different from said first estimation sequence, for estimating a change of the transmittance of said optical system relative to the exposing light;

a control device, which is connected with said storage device, that estimates a change of the transmittance of said optical system relative to the exposing light based upon said first estimation sequence and estimates a change of the transmittance of said optical system relative to the exposing light based upon said second estimation sequence; and an exposure quantity control device, which is connected with the control device, that controls the exposure quantity based upon the second estimation sequence after controlling the exposure quantity based upon the first estimation sequence over a predetermined period of time.

24. A method for manufacturing a semiconductor device, comprising:

obtaining a first transmittance of an optical system relative to an exposing light before transferring an image of a pattern illuminated with the exposing light via said optical system provided within an optical path of said exposing light onto a first predetermined surface;

obtaining a second transmittance of said optical system after the image of the pattern is transferred onto said first predetermined surface;

obtaining a third transmittance of said optical system before transferring the image of the pattern onto a second predetermined surface different from said first predetermined surface; and controlling an exposure quantity of the exposing light to said second predetermined surface based upon said first transmittance, said second transmittance and said third transmittance.

25. A method for manufacturing a semiconductor device, comprising:

controlling an exposure quantity of exposing light to a predetermined surface based upon a first estimation sequence for estimating a change of a transmittance of an optical system relative to the exposing light;

estimating the change of the transmittance of said optical system relative to the exposing light based upon a second estimation sequence which is different from said first estimation sequence after controlling the exposure quantity of the exposing light based upon said first estimation sequence for a predetermined period of time; and controlling the exposure quantity of the exposing light to said predetermined surface based upon the estimated change of the transmittance of said optical system.

* * * * *